US009623439B2

(12) United States Patent
Ito et al.

(10) Patent No.: US 9,623,439 B2
(45) Date of Patent: Apr. 18, 2017

(54) METHOD OF FORMING FILM

(71) Applicant: CANON KABUSHIKI KAISHA, Tokyo (JP)

(72) Inventors: Toshiki Ito, Kawasaki (JP); Naoko Matsufuji, Yokohama (JP); Kanae Kawahata, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 268 days.

(21) Appl. No.: 14/349,941

(22) PCT Filed: Oct. 19, 2012

(86) PCT No.: PCT/JP2012/077665
§ 371 (c)(1),
(2) Date: Apr. 4, 2014

(87) PCT Pub. No.: WO2013/062068
PCT Pub. Date: May 2, 2013

(65) Prior Publication Data
US 2015/0050426 A1 Feb. 19, 2015

(30) Foreign Application Priority Data
Oct. 24, 2011 (JP) .................. 2011-232717

(51) Int. Cl.
C08F 2/48 (2006.01)
B05D 3/06 (2006.01)
(Continued)

(52) U.S. Cl.
CPC .............. B05D 3/06 (2013.01); B82Y 10/00 (2013.01); B82Y 40/00 (2013.01); G03F 7/0002 (2013.01);
(Continued)

(58) Field of Classification Search
CPC ......... B05D 3/06; G03F 7/0002; G03F 7/022; G03F 7/038; G03F 7/027; B82Y 40/00; B82Y 10/00
(Continued)

(56) References Cited

U.S. PATENT DOCUMENTS 5,232,816 A * 8/1993 Seio ..................... G03F 7/0233
430/165
8,419,995 B2 4/2013 Yoneda et al.
(Continued)

FOREIGN PATENT DOCUMENTS

JP 2005-64143 A 3/2005
JP 2007-81048 A 3/2007
(Continued)

OTHER PUBLICATIONS

Matthew Colburn et al., "Step and Flash Imprint Lithography: A New Approach to High-Resolution Patterning," Proc. 3676 SPIE 379-389 (Mar. 1999).
(Continued)

Primary Examiner — Robert S Walters, Jr.
(74) Attorney, Agent, or Firm — Fitzpatrick, Cella, Harper & Scinto

(57) ABSTRACT

Provided is a method of manufacturing a film, including: applying, onto a substrate, a photocurable composition containing a polymerizable monomer, a photopolymerization initiator, and a photosensitive gas generator that generates a gas through light stimulation to form an applied film; bringing a mold into contact with the applied film; irradiating the applied film with light through the mold to cure the applied film and to generate the gas in the applied film; and releasing the mold from the applied film after the irradiation of the applied film with the light to form a film (cured film) having a predetermined pattern shape on the substrate, in
(Continued)

which in the irradiation of the applied film with the light, a reaction rate of a polymerization reaction of the polymerizable monomer in the applied film is higher than a reaction rate of a gas-generating reaction of the photosensitive gas generator in the applied film.

8 Claims, 8 Drawing Sheets

(51) Int. Cl.
    *G03F 7/00*     (2006.01)
    *G03F 7/022*     (2006.01)
    *G03F 7/027*     (2006.01)
    *G03F 7/038*     (2006.01)
    *B82Y 10/00*     (2011.01)
    *B82Y 40/00*     (2011.01)

(52) U.S. Cl.
    CPC .............. *G03F 7/022* (2013.01); *G03F 7/027* (2013.01); *G03F 7/038* (2013.01)

(58) Field of Classification Search
    USPC ........................................................ 427/508
    See application file for complete search history.

(56) References Cited

U.S. PATENT DOCUMENTS

| | | | |
|---|---|---|---|
| 8,852,848 | B2 | 10/2014 | Wu et al. |
| 2004/0016504 | A1 | 1/2004 | Mitarai |
| 2005/0074705 | A1 | 4/2005 | Toyoda |
| 2006/0062922 | A1* | 3/2006 | Xu .......................... B82Y 10/00 427/372.2 |
| 2008/0166871 | A1* | 7/2008 | Allen .................... C09D 183/06 438/623 |
| 2009/0263631 | A1* | 10/2009 | Sakamoto .............. B82Y 10/00 428/195.1 |
| 2010/0078860 | A1 | 4/2010 | Yoneda et al. |
| 2010/0248163 | A1 | 9/2010 | Ito |

FOREIGN PATENT DOCUMENTS

| | | |
|---|---|---|
| JP | 2010-262980 A | 11/2010 |
| JP | 2011-71299 A | 4/2011 |
| KR | 10-2010-0035617 A | 4/2010 |
| TW | 2012-13467 A1 | 4/2012 |
| WO | 2010/005032 A1 | 1/2010 |

OTHER PUBLICATIONS

Extended European Search Report in European Application No. 12843863.7 (issued May 11, 2015).

First Office Action in Chinese Application No. 201280051649.5 (issued Oct. 23, 2015).

Office Action in Taiwanese Application No. 101138916 (Sep. 24, 2014).

Notice of Preliminary Rejection in Korean Application No. 10-2014-7013187 (mailed Sep. 24, 2015).

* cited by examiner

METHOD OF FORMING FILM

TECHNICAL FIELD

The present invention relates to a method of forming a film (thin film), in particular, a method of forming a film formed of an organic compound to be formed into a predetermined shape by nanoimprint involving utilizing light.

BACKGROUND ART

A semiconductor integrated circuit has become finer and more integrated in recent years. Photolithography has been frequently used as a pattern formation technology for realizing microprocessing. In addition, for example, an improvement in accuracy of an apparatus for a photolithography technology has been currently advanced. However, the photolithography technology cannot cope with a requirement of processing accuracy in an excess condition of the diffraction limit of exposure light to be used in the photolithography.

In view of the foregoing, a nanoimprint method, that enables better microprocessing has been proposed. The nanoimprint method is one kind of pattern formation technology for a thin film involving pressing a mold in which a fine irregular pattern has been formed against a substrate to which a resin thin film has been applied to transfer the irregularity of the mold onto the resin thin film applied and formed onto the substrate.

Of such nanoimprint methods, a photo-nanoimprint method introduced in, for example, Non-patent Literature 1 has been attracting attention. The photo-nanoimprint method is a method involving: imprinting a mold transparent with respect to exposure light on a photocurable composition applied onto a substrate; curing the photocurable composition by photoirradiation; and releasing the mold from the cured product to manufacture a fine resist pattern integral with the substrate.

However, several challenges to be solved arise upon utilization of the photo-nanoimprint method. One of the challenges is that a force required to release the mold from the cured product, i.e., a release force is large. In other words, the photo-nanoimprint method causes such problems as described below owing to the large release force. A defect occurs in the pattern or the substrate floats from a stage to reduce positioning accuracy between the mold and the substrate.

To cope with the challenge, Patent Literature 1 and Patent Literature 2 each propose the following method. A photocurable composition to which a gas generator that generates a gas such as nitrogen or carbon dioxide through a photoreaction has been added is used and the release force is reduced with the pressure of the gas generated by photoirradiation.

However, in the method, of Patent Literature 1, the performance of the photoirradiation results in simultaneous or competitive occurrence of the curing reaction of the photocurable composition and the gas-generating reaction. As a result, the gas is generated from the gas generator in a state where the photo-curing of the photocurable composition is insufficient. Accordingly, such a problem that a pattern defect occurs owing to a bubble or a sufficient release force-reducing effect is not obtained after the photo-curing has arisen.

It should be noted that Patent Literature 2 proposes, as a solution to the challenge of the gas generation, that the photo-curing reaction of the photocurable composition and the gas-generating reaction are performed in steps different from each other. However, the adoption of the method causes the following new challenges. The number of steps is large and productivity is low.

CITATION LIST

Patent Literature

PTL 1: Japanese Patent Application Laid-Open No. 2010-262960
PTL 2: International Patent WO2010/005032

Non Patent Literature

NPL 1: SPIE, Vol. 3676, P. 379

SUMMARY OF INVENTION

Technical Problem

The present invention has been made in view of the challenges of the prior art and an object of the present invention is to provide a method of manufacturing a film requiring a small release force, leading to a small number of defects due to bubbling, and excellent in productivity.

The method of manufacturing a film of the present invention is a method of manufacturing a film, including: applying, onto a substrate, a photocurable composition containing a polymerizable monomer and a photosensitive gas generator that generates a gas through light stimulation to form an applied film; bringing a mold into contact with the applied film; irradiating the applied film with light through the mold to cure the applied film and to generate the gas in the applied film; and releasing the mold from the applied film after the irradiation of the applied film with the light to form a film having a predetermined pattern shape on the substrate, in which in the irradiation of the applied film with the light, a reaction rate of a polymerization reaction of the polymerizable monomer in the applied film is higher than a reaction rate of a gas-generating reaction of the photosensitive gas generator in the applied film.

According to the present invention, there can be provided a method of manufacturing a film requiring a small release force, leading to a small number of defects due to bubbling, and excellent in productivity.

Further features of the present invention will become apparent from the following description of exemplary embodiments (with reference to the attached drawings).

BRIEF DESCRIPTION OF DRAWINGS

FIGS. 2A, 2B-1, 2B-2, 2C-1, 2C-2, 2D-1 and 2D-2 are schematic sectional views illustrating the details of a photoirradiation step.

DESCRIPTION OF EMBODIMENT

Hereinafter, an embodiment of the present invention is described, in detail with reference to drawings as appropriate, provided that the following description is merely one embodiment and the present invention is not limited to the embodiment to be described below. An embodiment as a result of an appropriate modification, improvement; or the like of the following embodiment based on the ordinary knowledge of a person skilled in the art without any deviation, from the gist of the present invention, can also be included in the scope of the present invention.

FIGS. 1A, 1B-1, 1B-2, 1C, 1D, 1F and 1F are each, a schematic sectional view illustrating an example of the manufacturing process of a method of manufacturing a film of the present invention.

As illustrated in FIGS. 1A, 1B-1, 1B-2, 1C, 1D, 1E and 1F, the method of manufacturing a film (thin film whose thickness is at a sub-micron level) of the present invention includes steps described in the following items (i) to (v). It should be noted that in the present invention, the method includes at least the steps described in the following items (i) to (iv). In addition, upon actual manufacture of a film, the step of preparing a photocurable composition containing a polymerizable monomer and a photosensitive gas generator that generates a gas through light stimulation (photocurable composition-preparing step) is performed before the step described in the following item (i) (applied film-forming step).

Figure 1A:
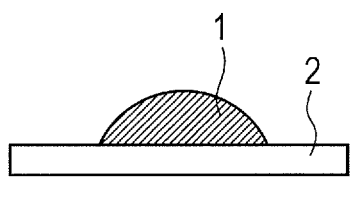
FIGS. 1A, 1B-1, 1B-2, 1C, 1D, 1E and 1F are each a schematic sectional view illustrating an example of the manufacturing process of a method of manufacturing a film of the present invention.

(i) The step of applying a photocurable composition 1 onto a substrate 2 to form an applied film (applied film-forming step, FIG. 1A). (It should be noted that the term "applied film" as used in the specification is a generic term for all shapes that change, i.e., comprehends the photocurable composition 1, a layer 10 to be subjected to shape transfer, and a cured product 11.)

Figure 1C:
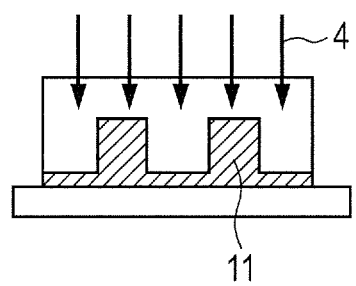
Figures 1, 1B:
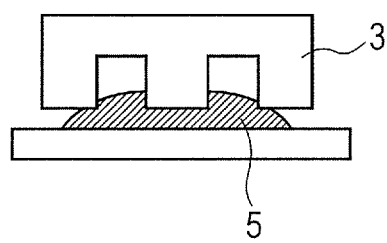
Figure 1D:
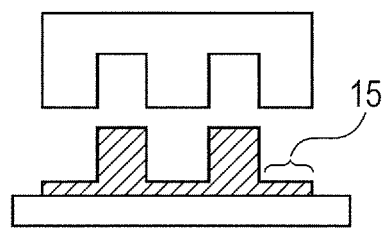
Figures 1, 1B, 2:
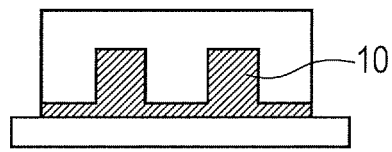

(ii) The step of bringing a mold 3 into contact with the applied film (imprinting step, FIGS. 1B-1 and 1B-2). At this stage, the photocurable composition does not cure and the applied film in this state is referred to as "layer 10 to be subjected to shape transfer."

(iii) The step of irradiating the applied film with light 4 through the mold 3 to cure the applied film and to generate the gas in the applied film (photoirradiation step, FIG. 1C). The applied film in a cured state is referred to as "cured product 11."

(iv) The step of releasing the mold from the applied film after the irradiation of the applied film with the light 4 to form a film having a predetermined pattern shape on the substrate (releasing step, FIG. 1D).

Figure 1E:
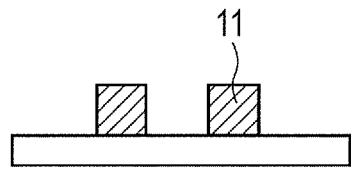

(v) The step of removing a residual film 15 remaining in a region from which the applied film should be removed out of the pattern shape (residual film-removing step, FIG. 1E).

Figure 1F:
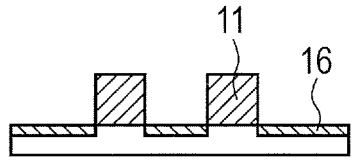

(vi) The step of processing the substrate by means of the pattern shape (substrate-processing step, FIG. 1F).

Through the steps described in the items (i) to (vi) (or the steps described in the items (i) to (v)), the photo-cured product 11 and an electronic component (electronic device) or optical component having the photo-cured product 11 can be obtained from the photocurable photocurable composition 1.

In addition, the present invention is characterized in that in the step (iii) (step of irradiating the applied film with the light), the reaction rate of the polymerization reaction of the polymerizable monomer in the applied film is higher than the reaction rate of the gas-generating reaction of the photosensitive gas generator in the applied film. The foregoing means that in the present invention, upon photoirradiation, the elimination rate of a carbon-carbon double bond (>C=C<) which the polymerizable monomer has is higher than the elimination rate of a gas-generating functional group of the photosensitive gas generator.

Hereinafter, the steps (i) to (v) and the photocurable composition-preparing step as a step prior to the step (i) are described in detail. It should be noted that the method of manufacturing a thin film of the present invention is a nanoimprint method involving using light. In addition, a film to be manufactured by the manufacturing method of the present invention is such that a pattern having a size of 1 nm to 10 mm is preferably formed and a pattern having a size of about 10 nm to 100 μm is more preferably formed.

(1) Photocurable Composition-Preparing Step

First, the step of preparing the photocurable composition containing the polymerizable monomer and the photosensitive gas generator that generates a gas through light stimulation (photocurable composition-preparing step) is performed.

The photocurable composition to be used in the manufacturing method of the present invention contains at least the polymerizable monomer (component A), a photopolymerization initiator (component B), and the photosensitive gas generator (component C). It should be noted that the photocurable composition to be used may further contain any other additive component in addition to the component A, the component B, and the component C.

(1-1) Polymerizable Monomer (component A)

Examples of the polymerizable monomer (component A) in the photocurable composition include a radical polymerizable monomer and a cation polymerizable monomer. Hereinafter, specific examples of the polymerizable monomer in the photocurable composition are described.

(1-1a) Radical Polymerizable Monomer

When the radical polymerizable monomer is used, to be specific, a compound having one or more acryloyl groups ($CH_2$=CHCOO—) or methacryloyl groups ($CH_2$=C($CH_3$)COO—) is preferred.

As monofunctional (meth)acrylic compounds having one acryloyl group or methacryloyl group, there are exemplified, for example, phenoxyethyl (meth)acrylate, phenoxy-2-methylethyl (meth)acrylate, phenoxyethoxyethyl (meth)acrylate, 3-phenoxy-2-hydroxypropyl (meth)acrylate, 2-phenylphenoxyethyl (meth)acrylate, 4-phenylphenoxyethyl (meth)acrylate, 3-(2-phenylphenyl)-2-hydroxypropyl (meth)acrylate, EO-modified p-cumylphenyl (meth)acrylate, 2-bromophenoxyethyl (meth)acrylate, 2,4-dibromophenoxyethyl(meth)acrylate, 2,4,6-tribromophenoxyethyl(meth)acrylate, EO-modified phenoxy (meth)acrylate, PO-modified phenoxy (meth)acrylate, polyoxyethylene nonylphenyl ether (meth)acrylate, isobornyl (meth)acrylate, 1-adamantyl (meth)acrylate, 2-methyl-2-adamantyl (meth)acrylate, 2-ethyl-2-adamantyl (meth)acrylate, bornyl (meth)acrylate, tricyclodecanyl (meth)acrylate, dicyclopentanyl (meth)acrylate, dicyclopentenyl (meth)acrylate, cyclohexyl (meth)acrylate, 4-butylcyclohexyl (meth)acrylate, acryloyl morpholine, 2-hydroxyethyl (meth)acrylate, 2-hydroxypropyl (meth)acrylate, 2-hydroxybutyl (meth)acrylate, methyl (meth)acrylate, ethyl (meth)acrylate, propyl (meth) acrylate, isopropyl (meth)acrylate, butyl (meth)acrylate, amyl (meth) acrylate, isobutyl (meth)acrylate, t-butyl (meth)acrylate, pentyl (meth)acrylate, isoamyl (meth)acrylate, hexyl (meth) acrylate, heptyl (meth)acrylate, octyl (meth)acrylate, isooctyl (meth)acrylate, 2-ethylhexyl (meth)acrylate, nonyl (meth)acrylate, decyl (meth)acrylate, isodecyl (meth) acrylate, undecyl (meth)acrylate, dodecyl (meth)acrylate, lauryl (meth)acrylate, stearyl (meth)acrylate, isostearyl (meth) acrylate, benzyl (meth)acrylate, tetrahydrofurfuryl (meth) acrylate, butoxyethyl (meth)acrylate, ethoxy diethylene glycol (meth)acrylate, polyethylene glycol mono(meth) acrylate, polypropylene glycol mono(meth)acrylate, methoxy ethylene glycol (meth)acrylate, ethoxyethyl (meth) acrylate, methoxy polyethylene glycol (meth)acrylate, methoxy polypropylene glycol (meth)acrylate, diacetone (meth)acrylamide, isobutoxymethyl (meth)acrylamide, N,N-dimethyl (meth)acrylamide, t-octyl (meth)acrylamide, dimethylaminoethyl (meth)acrylate, diethylaminoethyl (meth)acrylate, 7-amino-3,7-dimethyloctyl (meth)acrylate, N,N-diethyl (meth)acrylamide, N,N-dimethylaminopropyl (meth)acrylamide, and the like, but are not limited thereto.

Of those compounds, as commercially available monofunctional (meth)acrylic compounds, there are exemplified, for example, Aronix M101, M102, M110, M111, M113, M117, M5700, TO-1317, M120, M150, and M156 (all of the above are manufactured by TOAGOSEI CO., LTD); MEDOL10, MIBDOL10, CHDOL10, MMDOL30, MEDOL30, MIBDOL30, CHDOL30, LA, IBXA, 2-MTA, HPA, and Viscoat #150, #155, #158, #190, #192, #193, #220, #2000, #2100, and #2150 (all of the above are manufactured by OSAKA ORGANIC CHEMICAL INDUSTRY LTD.); Light Acrylate BO-A, EC-A, DMP-A, THF-A, KOP-A, HOA-MPE, HOA-MPL, PO-A, P-200A, NP-4EA, and NP-8EA, and Epoxy Ester M-600A (all of the above are manufactured by KYOEISHA CHEMICAL Co., LTD); KAYARAD TC110S, R-564, and R-128H (all of the above are manufactured by NIPPON KAYAKD Co., Ltd.); NK Ester AMP-10G and AMP-20G (both of the above are manufactured by Shin-Nakamura Chemical Co., Ltd.); FA-511A, 512A, and 513A (all of the above are manufactured by Hitachi Chemical Co., Ltd.); PHEPPHERE, CEA, PHE-2, PHE-4, BR-31, BR-31M, and BR-32 (all of the above are manufactured by Dai-ichi Kogyo Seiyaku Co., Ltd.); VP (manufactured by BASF); ACMO, DMAA, and DMAPAA (all of the above are manufactured by KOHJIN Co., Ltd.), and the like, but are not limited thereto.

As polyfunctional (meth)acrylic compounds having two or more acryloyl groups or methacryloyl groups, there are exemplified, for example, trimethylolpropane di(meth)acrylate, trimethylolpropane tri(meth)acrylate, EO-modified trimethylolpropane tri(meth)acrylate, PO-modified trimethyloipropane tri(meth)acrylate, EO,PO-modified trimethylolpropane tri(meth)acrylate, pentaerythritol tri(meth)acrylate, pentaerythritol tetra(meth)acrylate, ethylene glycol di(meth)acrylate, tetraethylene glycol di(meth)acrylate, polyethylene glycol di(meth)acrylate, polypropylene glycol di(meth)acrylate, 1,4-butanediol di(meth)acrylate, 1,6-hexanediol di(meth)acrylate, neopentyl glycol di(meth)acrylate, tris(2-hydroxyethyl)isocyanurate tri(meth)acrylate, tris(acryloyloxy)isocyanurate(meth)acrylate, bis(hydroxymethyl)tricyclodecane di(meth)acrylate, dipentaerythritol penta (meth)acrylate, dipentaerythritol hexa(meth)acrylate, EO-modified 2,2-bis(4-((meth)acryloxy)phenyl)propane, PO-modified 2,2-bis(4-((meth)acryloxy)phenyl)propane, EO, PO-modified 2,2-bis(4-((meth)acryloxy)phenyl)propane, and the like, but are not limited thereto. It should be noted that the abbreviation "EO" represents ethylene oxide, and the EO-modified compound has a block structure of an ethylene oxide group. In addition, the abbreviation "PO" represents propylene oxide, and the PO-modified compound has a block structure of a propylene oxide group.

Of those compounds, as commercially available polyfunctional (meth)acrylic compounds, there are exemplified, for example, Upimer UV SA1002 and SA2007 (both of the above are manufactured by Mitsubishi Chemical Corporation); Viscoat #195, #230, #215, #260, #335HP, #295, #300, #360, #700, GPT, and 3PA (all of the above are manufactured by OSAKA ORGANIC CHEMICAL INDUSTRY LTD.); Light Acrylate 4EG-A, 9EG-A, HP-A, DCP-A, BP-4EA, BP-4PA, TMP-A, PE-3A, PE-4A, and DPE-6A (all of the above are manufactured by KYOEISHA CHEMICAL Co., LTD); KAYARAD PET-30, TMPTA, R-604, DPHA, DPCA-20, -30, -60, and -120, HX-620, D-310, and D-330 (all of the above are manufactured by NIPPON KAYAKU Co., Ltd.); Aronix M208, M210, M215, M220, M240, M305, M303, M310, M315, M325, and M400 (all of the above are manufactured by TOAGOSEI CO., LTD); Lipoxy VR-77, VR-60, and VR-90 (all of the above are manufactured by SHOWA HIGHPOLYMER CO., LTD.), and the like, but are not limited thereto.

One kind of the radical polymerizable monomers listed in the foregoing may be used alone, or two or more kinds thereof may be used in combination.

(1-1b) Cation Polymerizable Monomer

The cation polymerizable monomer is preferably a compound having one or more vinyl ether groups ($CH_2$=CH—O—), epoxy groups, or oxetanyl groups.

As compounds having one vinyl ether group, there are exemplified, for example, methyl vinyl ether, ethyl vinyl ether, propyl vinyl ether, n-butyl vinyl ether, t-butyl vinyl ether, 2-ethylhexyl vinyl, ether, n-nonyl vinyl ether, lauryl vinyl ether, cyclohexyl vinyl ether, cyclohexylmethyl vinyl ether, 4-methylcyclohexylmethyl vinyl ether, benzyl vinyl ether, dicyclopentenyl vinyl ether, 2-dicyclopentenoxyethyl vinyl ether, methoxyethyl vinyl ether, ethoxyethyl vinyl ether, butoxyethyl vinyl ether, methoxyethoxyethyl vinyl ether, ethoxyethoxyethyl vinyl ether, methoxy polyethylene glycol vinyl ether, tetrahydrofurfuryl vinyl ether, 2-hydroxyethyl vinyl ether, 2-hydroxypropyl vinyl ether, 4-hydroxybutyl vinyl, ether, 4-hydroxymethylcyclohexylmethyl vinyl ether, diethylene glycol monovinyl ether, polyethylene glycol vinyl ether, chloroethyl vinyl ether, chlorobutyl vinyl ether, chloroethoxyethyl vinyl ether, phenylethyl vinyl ether, phenoxy polyethylene glycol vinyl ether, and the like, but are not limited thereto.

As compounds having two or more vinyl ether groups, there are exemplified, for example, divinylethers such as ethylene glycol divinyl ether, diethylene glycol divinyl ether, polyethylene glycol divinyl ether, propylene glycol divinyl ether, butylene glycol divinyl ether, hexanediol divinyl ether, bisphenol A alkylene oxide divinyl ether, and bisphenol F alkylene oxide divinyl ether; and polyfunctional vinyl ethers such as trimethylolethane trivinyl ether, trimethylolpropane trivinyl ether, ditrimethylolpropane tetravinyl ether, glycerin, trivinyl ether, pentaerythritol tetravinyl ether, dipentaerythritol pentavinyl ether, dipentaerythritol hexavinyl ether, an ethylene oxide adduct of trimethylolpropane trivinyl ether, a propylene oxide adduct of trimethylolpropane trivinyl ether, an ethylene oxide adduct of ditrimethylolpropane tetravinyl ether, a propylene, oxide adduct of ditrimethylolpropane tetravinyl ether, an ethylene oxide adduct of pentaerythritol tetravinyl ether, a propylene oxide adduct of pentaerythritol tetravinyl ether, an ethylene oxide adduct of dipentaerythritol hexavinyl ether, a propylene oxide adduct of dipentaerythritol hexavinyl ether, and the like, but are not limited thereto.

As compounds having one epoxy group, there are exemplified, for example, phenyl glycidyl ether, p-tert-butylphenyl glycidyl ether, butyl glycidyl ether, 2-ethylhexyl glycidyl ether, allyl glycidyl ether, 1,2-butylene oxide, 1,3-butadiene monooxide, 1,2-epoxydodecane, epichloronydrin, 1,2-epoxydecane, styrene oxide, cyclohexene oxide, 3-methacryloyloxymethylcyclohexene oxide, 3-acryloyloxymethylcyclohexene oxide, 3-vinylcyclohexene oxide, and the like, but are not limited thereto.

As compounds having two or more epoxy groups, there are exemplified, for example, bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, an epoxy novolac resin, hydrogenated bisphenol A diglycidyl ether, hydrogenated bisphenol F diglycidyl ether, hydrogenated bisphenol S diglycidyl ether, 3,4-epoxycyclohexylmethyl-3',4'-epoxycyclohexane carboxylate, 2-(3,4-epoxycyclohexyl-5,5-spiro-3,4-epoxy)cyclohexane-methadioxane, bis(3,4-epoxycyclohexylmethyl) adipate, vinylcyclonexene oxide, 4-vinylepoxycyclohexane, bis(3,4-epoxy-6-methylcyclohexylmethyl) adipate, 3,4-epoxy-6-methylcyclohexyl-3',4'-epoxy-6'-methylcyclohexane carboxylate, methylene bis(3,4-epoxycyclohexane), dicyclopentadiene diepoxide, a di(3,4-epoxycyclohexylmethyl) ether of ethylene glycol, ethylene bis(3,4-epoxycyclohexane carboxylate), dioctyl epoxyhexahydrophthalate, di-2-ethylhexyl epoxyhexahydrophthalate, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers, 1,1,3-tetradecadiene dioxide, limonene dioxide, 1,2,7,8-diepoxyoctane, 1,2,5,6-diepoxycyclooctane, and the like, but are not limited thereto.

As compounds having one oxetanyl group, there are exemplified, for example, 3-ethyl-3-hydroxymethyloxetane, 3-(meth)allyloxymethyl-3-ethyloxetane, (3-ethyl-3-oxetanylmethoxy)methylbenzene, 4-fluoro[1-(3-ethyl-3-oxetanylmethoxy)methyl]benzene, 4-methoxy[1-(3-ethyl-3-oxetanylmethoxy)methyl]benzene, [1-(3-ethyl-3-oxetanylmethoxy)ethyl]phenyl ether, isobutoxymethyl (3-ethyl-3-oxetanylmethyl) ether, isobornyloxyethyl (3-ethyl-3-oxetanylmethyl) ether, isobornyl (3-ethyl-S-oxetanylmethyl) ether, 2-ethylhexyl (3-ethyl-3-oxetanylmethyl) ether, ethyldiethylene glycol (3-ethyl-3-oxetanylmethyl) ether, dicyclopentadiene (3-ethyl-3-oxetanylmethyl) ether, dicyclopentenyloxyethyl (3-ethyl-3-oxetanylmethyl) ether, dicyclopentenyl (3-ethyl-3-oxetanylmethyl) ether, tetrahydrofurfuryl (3-ethyl-3-oxetanylmethyl) ether, tetrabromophenyl (3-ethyl-3-oxetanylmethyl) ether, 2-tetrabromophenoxyethyl (3-ethyl-3-oxetanylmethyl) ether, tribromophenyl (3-ethyl-3-oxetanylmethyl) ether, 2-tribromophenoxyethyl (3-ethyl-3-oxetanylmethyl) ether, 2-hydroxyethyl (3-ethyl-3-oxetanylmethyl) ether, 2-hydroxypropyl (3-ethyl-3-oxetanylmethyl) ether, butoxyethyl (3-ethyl-3-oxetanylmethyl) ether, pentachlorophenyl (3-ethyl-3-oxetanylmethyl) ether, pentabromophenyl (3-ethyl-3-oxetanylmethyl) ether, bornyl (3-ethyl-3-oxetanylmethyl) ether, and the like, but are not limited thereto.

As compounds having two or more oxetanyl groups, there are exemplified, for example, polyfunctional oxetanes such as 3,7-bis(3-oxetanyl)-5-oxa-nonane, 3,3'-(1,3-(2-methylenyl)propanediyl bis(oxymethylene)) bis(3-ethyloxetane), 1,4-bis[(3-ethyl-3-oxetanylmethoxy)methyl]benzene, 1,2-bis[(3-ethyl-3-oxetanylmethoxy)methyl]ethane, 1,3-bis[(3-ethyl-3-oxetanylmethoxy)methyl]propane, ethylene glycol bis(3-ethyl-3-oxetanylmethyl) ether, dicyclopentenyl bis(3-ethyl-3-oxetanylmethyl) ether, triethylene glycol bis(3-ethyl-3-oxetanylmethyl) ether, tetraethylene glycol bis(3-ethyl-3-oxetanylmethyl) ether, tricyclodecanediyl dimethylene (3-ethyl-3-oxetanylmethyl) ether, trimethylolpropane tris(3-ethyl-3-oxetanylmethyl) ether, 1,4-bis(3-ethyl-3-oxetanylmethoxy)butane, 1,6-bis(3-ethyl-3-oxetanylmethoxy)hexane, pentaerythritol tris(3-ethyl-3-oxetanylmethyl) ether, pentaerythritol tetrakis(3-ethyl-3-oxetanylmethyl) ether, polyethylene glycol bis(3-ethyl-3-oxetanylmethyl) ether, dipentaerythritol hexakis(3-ethyl-3-oxetanylmethyl) ether, dipentaerythritol pentakis (3-ethyl-3-oxetanylmethyl) ether, dipentaerythritol tetrakis(3-ethyl-3-oxetanylmethyl) ether, caprolactone-modified dipentaerythritol hexakis(3-ethyl-3-oxetanylmethyl) ether, caprolactone modified dipentaerythritol pentakis(3-ethyl-3-oxetanylmethyl) ether, ditrimethylolpropane tetrakis(3-methyl-3-oxetanyl methyl) ether, EO-modified bisphenol A bis(3-ethyl-3-oxetanylmethyl) ether, PO-modified bisphenol. A bis(3-ethyl-3-oxetanylmethyl) ether, EO-modified hydrogenated bisphenol A bis(3-ethyl-3-oxetanylmethyl) ether, PO-modified hydrogenated bisphenol A bis(3-ethyl-3-oxetanylmethyl) ether, EO-modified bisphenol F (3-ethyl-3-oxetanylmethyl) ether, and the like, but are not limited thereto. It should be noted that the abbreviation "EG" represents ethylene oxide and the EO-modified compound has a block structure of an ethylene oxide group. In addition, the abbreviation "PO" represents propylene oxide and the PO-modified compound has a block structure of a propylene oxide group. In addition, the term "hydrogenated" means the addition of a hydrogen atom to a C=C double bond of a benzene ring or the like. For example, the term, "hydrogenated bisphenol A" refers to such bisphenol A that a hydrogen atom is added to a benzene ring to turn the ring into a cyclohexane structure.

One kind of the cation polymerizable monomers listed in the foregoing may be used alone, or two or more kinds thereof may be used in combination.

(1-2) Photopolymerization Initiator (Component B)

The photopolymerization initiator (component B) in the photocurable composition, needs to be appropriately selected in accordance with the nature of the polymerizable monomer (component A). Specifically, when a radical polymerizable monomer is used as the component A, a photo-radical generator is used. In addition, when a cation polymerizable monomer is used as the component A, a photoacid generator is used.

(1-2a) Photo-Radical Generator

The photo-radical, generator is a compound, which causes a chemical reaction, generates a radical, and is capable of initiating radical polymerization through the irradiation of radiation such as charged particle rays including as infrared light, visible light, ultraviolet light, far ultraviolet light, X rays, electron rays, and the like.

As such compounds, there are exemplified, for example, 2,4,5-triarylimidazole dimers which may be substituted such as a 2-(o-chlorophenyl)-4,5-diphenylimidazole dimer, a 2-(o-chlorophenyl)-4,5-di((methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; aromatic ketone derivatives such as 2-benzyl-2-dimethylamino-1-(4-morpholinophenyl)-butanone-1, 2-methyl-1-[4-methylthio)phenyl]-2-morpholino-propanone-1-one; quinones such as 2-ethylantraquinone, phenanthrenequinone, 2-t-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acrydine derivatives such as 9-phenylacrydine and 1,7-bis(9,9'-acrydinyl)heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropyl thioxanthone, and 2-chloro thioxanthone; and xanthone, fluorenone, benzaldehyde, fluorene, anthraquinone, triphenylamine, carbazole, 1-(4-isopropylphenyl)-2-hydroxy-2-methylpropan-1-one, 2-hydroxy-2-methyl-1-phenylpropan-1-one, 2,4,6-trimethylbenzoyldiphenylphosphine oxide, bis(2,6-dimethoxybenzoyl)-2,4,4-trimethylpentylphosphine oxide, and the like, but are not limited thereto.

Of those compounds, as commercially available photo-radical generators, there are exemplified, for example, Irgacure 184, 369, 651, 500, 819, 907, 784, and 2959, CGI-1700, -1750, and -1850, CG24-61, and Darocur 1116 and 1173 (all of the above are manufactured by Ciba Japan), Lucirin TPO, LR8893, and LR8970 (all of the above are manufactured by BASF), Ubecryl P36 (manufactured by UCB), and the like, but are not limited thereto.

One kind of the optical generators listed in the foregoing may be used alone, or two or more kinds thereof may be used in combination.

(1-2b) Photo-Acid Generator

The photo-acid generator is a compound, which causes a chemical reaction and is capable of generating an acid (proton) to initiate cation polymerization through the irradiation of radiation such as charged particle rays including as infrared light, visible light, ultraviolet light, far ultraviolet light, X rays, electron rays, and the like. As such compounds, there are exemplified, for example, an onium salt compound, a sulfone compound, a sulfonic acid ester compound, a sulfonimide compound, a diazomethane compound, and the like, but is not limited thereto. In the present invention, it is preferred to use the onium salt compound.

As onium salt compounds, there are exemplified, for example, an iodonium salt, a sulfonium salt, a phosphonium salt, a diazonium salt, an ammonium salt, and a pyridinium salt. Specific examples of the onium salt compound include bis(4-t-butylphenyl)iodonium perfluoro-n-butanesulfonate, bis(4-t-butylphenyl)iodonium trifluoromethanesulfonate, bis(4-t-butylphenyl)iodonium 2-trifluoromethylbenzenesulfonate, bis(4-t-butylphenyl)iodonium pyrenesulfonate, bis(4-t-butylphenyl)iodonium n-dodecylbenzenesulfonate, bis(4-t-butylphenyl)iodonium p-toluenesulfonate, bis(4-t-butylphenyl)iodonium benzenesulfonate, bis(4-t-butylphenyl)iodonium 10-camphorsulfonate, bis(4-t-butylphenyl)iodonium n-octanesulfonate, diphenyliodonium perfluoro-n-butanesulfonate, diphenyliodonium trifluoromethanesulfonate, diphenyliodonium 2-trifluoromethylbenzenesulfonate, diphenyliodonium pyrenesulfonate, diphenylidonium n-dodecylbenzenesulfonate, diphenyliodonium p-toluenesulfonate, diphenylidonium benzenesulfonate, diphenyliodonium 10-camphorsulfonate, diphenyliodonium n-octanesulfonate, triphenylsulfonium perfluoro-n-butanesulfonate, triphenylsulfonium trifluoromethanesulfonate, triphenylsulfonium 2-trifluoromethylbenzenesulfonate, triphenylsulfonium pyrenesulfonate, triphenylsulfonium n-dodecylbenzenesulfonate, triphenylsulfonium p-toluenesulfonate, triphenylsulfonium benzenesulfonate, triphenylsulfonium 10-camphorsulfonate, triphenylsulfonium n-octanesulfonate, diphenyl(4-t-butylphenyl)sulfonium perfluoro-n-butanesulfonate, diphenyl(4-t-butylphenyl)sulfonium trifluoromethanesulfonate, diphenyl (4-t-butylphenyl)sulfonium 2-trifluoromethylbenzenesulfonate, diphenyl(4-t-butylphenyl)sulfonium pyrenesulfonate, diphenyl(4-t-butylphenyl) sulfonium n-dodecylbenzenesulfonate, diphenyl(4-t-butylphenyl)sulfonium p-toluenesulfonate, diphenyl(4-t-butylphenyl)sulfonium benzenesulfonate, diphenyl(4-t-butylphenyl)sulfonium 10-camphorsulfonate, diphenyl(4-t-butylphenyl)sulfonium n-octanesulfonate, tris(4-methoxyphenyl)sulfonium perfluoro-n-butanesulfonate, tris(4-methoxyphenyl)sulfonium trifluoromethanesulfonate, tris(4-methoxyphenyl)sulfonium 2-trifluoromethylbenzenesulfonate, tris(4-methoxyphenyl)sulfonium pyrenesulfonate, tris(4-methoxyphenyl)sulfonium n-dodecylbenzenesulfonate, tris(4-methoxyphenyl)sulfonium p-toluenesulfonate, tris(4-methoxyphenyl)sulfonium benzenesulfonate, tris(4-methoxyphenyl)sulfonium 10-camphorsulfonate, and tris(4-methoxyphenyl)sulfonium n-octanesulfonate, but are not limited thereto.

As sulfone compounds, there are exemplified, for example, β-ketosulfone, β-sulfonylsulfone, and α-diazo compounds thereof. Specific examples of the sulfone compound include, but are not limited to, phenacyl phenyl sulfone, mesithyl phenacyl sulfone, bis(phenylsulfonyl) methane, and 4-trisphenacyl sulfone, but are not limited thereto.

As sulfonic acid ester compounds, there are exemplified, for example, an alkyl sulfonic acid ester, a haloalky sulfonic acid ester, an allyl sulfonic acid ester, and an iminosulfonate. Specific examples of the sulfonic acid ester compound include, but are not limited to, α-methylolbenzoin perfluoro-n-butanesulfonate, α-methylolbenzoin trifluoromethanesulfonate, and α-methylolbenzoin 2-trifluoromethylbenzenesulfonate, but are not limited thereto.

As specific examples of the sulfonimide compounds, there are exemplified, for example, N-(trifluoromethylsulfonyloxy)succinimide, N-(trifluoromethylsulfonyloxy)

phthalimide, N-(trifluoromethylsulfonyloxy)diphenylmaleimide, N-(trifluoromethylsulfonyloxy)bicyclo[2.2.1]hept-5-ene-2,3-dicarboximide, N-(trifluoromethylsulfonyloxy)-7-oxabicyclo[2.2.1]hept-5-ene-2,3-dicarboximide, N-(trifluoromethylsulfonyloxy)bicyclo[2.2.1]heptan-5,6-oxy-2,3-dicarboximide, N-(trifluoromethylsulfonyloxy)naphthylimide, N-(10-camphorsulfonyloxy)succinimide, N-(10-camphorsulfonyloxy)phthalimide, N-(10-camphorsulfonyloxy)diphenylmaleimide, N-(10-camphorsulfonyloxy)bicyclo[2.2.1]hept-5-ene-2,3-dicarboximide, N-(10-camphorsulfonyloxy)-7-oxabicyclo[2.2.1]hept-5-ene-2,3-dicarboximide, N-(10-camphorsulfonyloxy)bicyclo[2.2.1]heptan-5,6-oxy-2,3-dicarboximide, N-(10-camphorsulfonyloxy)naphthylimide, N-(4-methylphenylsulfonyloxy)succinimide, N-(4-methylphenylsulfonyloxy)phthalimide, N-(4-methylphenylsulfonyloxy)diphenylmaieimide, N-(4-methylphenylsulfonyloxy)bicyclo[2.2.1]hept-5-ene-2,3-dicarboximide, N-(4-methylphenylsulfonyloxy)-7-oxabicyclo[2.2.1]hept-5-ene-2,3-dicarboximide, N-(4-methylphenylsulfonyloxy)bicyclo[2.2.1]heptan-5,6-oxy-2,3-dicarboximide, N-(4-methylphenylsulfonyloxy)naphthylimide, N-(2-trifluoromethylphenylsulfonyloxy)succinimide, N-(2-trifluoromethylphenylsulfonyloxy)phthalimide, N-(2-trifluoromethylphenylsulfonyloxy)diphenylmaleimide, N-(2-trifluoromethylphenylsulfonyloxy)bicyclo[2.2.1.]hept-5-ene-2,3-dicarboximide, N-(2-trifluoromethylphenylsulfonyloxy)-7-oxabicyclo[2.2.1]hept-5-ene-2,3-dicarboximide, N-(2-trifluoromethylphenylsulfonyloxy)bicyclo[2.2.1]heptan-5,6-oxy-2,3-dicarboximide, N-(2-trifluoromethylphenylsulfonyloxy)naphthylimide, N-(4-fluorophenylsulfonyloxy)succinimide, N-(4-fluorophenyl)phthalimide, N-(4-fluorophenylsulfonyloxy)diphenylmaleimide, N-(4-fluorophenylsulfonyloxy)bicyclo[2.2.1]hept-5-ene-2,3-dicarboximide, N-(4-fluorophenylsulfonyloxy)-7-oxabicyclo[2.2.1]hept-5-ene-2,3-dicarboximide, N-(4-fluorophenylsulfonyloxy)bicyclo[2.2.1]heptan-5,6-oxy-2,3-dicarboximide, and N-(4-fluorophenylsulfonyloxy)naphthylimide, but are not limited thereto.

As specific examples of the diazomethane compound, there are exemplified, for example, bis(trifluoromethylsulfonyl)diazomethane, bis(cyclohexylsulfonyl)diazomethane, bis(phenylsulfonyl)diazomethane, bis(p-toluenesulfonyl)diazomethane, methylsulfonyl p-toluenesulfonyldiazomethane, (cyclonexylsulfonyl) (1,1-dimethylethylsulfonyl)diazomethane, and bis(1,1-dimethylethylsulfonyl)diazomethane, but are not limited thereto.

Of those photo-acid generators, the onium salt compound is preferred. In the present invention, one kind of the photo-acid generators listed in the foregoing may be used alone, or two or more kinds thereof may be used in combination.

A compounding ratio of the photopolymerization initiator (component B) is 0.01 wt % or more and 10 wt % or less, preferably 0.1 wt % or more and 7 wt % or less with respect to a total amount of the polymerizable monomer (component A) in the photocurable composition. If the compounding ratio of the component B is less than 0.01 wt %, its curing rate is lowered, thereby leading to a lower reaction efficiency. On the other hand, if the compounding ratio of the component B exceeds 10 wt %, the photocurable composition as the component A may be inferior in mechanical property of a cured product.

(1-3) Photosensitive Gas Generator (Component C)

The photosensitive gas generator (component C) in the photocurable composition refers to a substance that undergoes a chemical reaction (elimination reaction) when irradiated with light such as ultraviolet light to generate a gas. Examples of the photosensitive gas generator include an azo-based compound, a diazonium salt-based compound, an azido-based compound, a diazonaphthoquinone-based compound, a sulfohydrazide-based compound, a hydrazo-based compound, a nitrobenzyl carbamate-based compound, a benzoin carbamate-based compound, and a diazomethanesulfonic acid-based compound. It should be noted that the gas to be generated is, for example, a carbon dioxide, carbon monoxide, nitrogen, oxygen, or hydrogen, and preferably a carbon dioxide or nitrogen. As a compound generating nitrogen, there are exemplified, for example, an azo-based compound, a diazonium salt-based compound, an azido-based compound such as a 1,2-naphthoquinonediazide-5-sulfonic acid ester compound, a diazonaphthoquinone-based compound, and a nitrobenzyl carbamate-based compound. In addition, as a compound generating carbon dioxide, a benzoin carbamate-based compound is given.

The compounding ratio of the photosensitive gas generator (component C) is, for example, 0.1 wt % to 50 wt %, preferably 0.5 wt % to 20 wt %, more preferably 1 wt % to 10 wt % with respect to the total amount of the polymerizable monomer (component A) in the photocurable composition. When the compounding ratio of the photosensitive gas generator (component C) is set to less than 0.1 wt %, an effect of the present invention may not be sufficiently obtained. In addition, when the compounding ratio of the photosensitive gas generator (component C) exceeds 50 wt %, the mechanical strength of a photo-cured film cannot be sufficiently secured, which is responsible for the occurrence of a pattern defect.

It should be noted that as described in the foregoing, the present invention is characterized in that in the photoirradiation step (step (iii)) to be described later, the reaction rate of the polymerization reaction of the polymerizable monomer in the photocurable composition is higher than the reaction rate of the gas-generating reaction of the photosensitive gas generator in the photocurable composition. Accordingly, a combination of the photocurable monomer (component A) and the photosensitive gas generator (component C) is important in the present invention. The reason why the combination is important and an optimum example of the combination are described later.

(1-4) Others

In addition to the polymerizable monomer (component A), the photopolymerization initiator (component B), and the photosensitive gas generator (component C), an additive may be further incorporated into the photocurable composition to be used in the manufacturing method, of the present, invention depending on various purposes and to such an extent that the effect of the present, invention is not impaired. The term "additive" as used herein refers to, for example, a sensitizer, an antioxidant, a solvent, or a polymer component.

(1-4a) Sensitizer

The sensitizer is used for the purpose of accelerating the polymerization reaction or improving a reaction conversion ratio. A hydrogen donor or a sensitizing dye can be used as the sensitizer.

The hydrogen donor is a compound that reacts with an initiation radical generated from the photopolymerization initiator (component B) or a radical at a polymerization grower terminal to generate a radical having additionally high reactivity. The hydrogen donor is preferably added when the photopolymerization initiator (component B) is a photo-radical generator.

A known, commonly used compound may be used as the hydrogen donor. Specific examples thereof include, but not limited to, N-butylamine, di-n-butylamine, tri-n-butylphosphine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, amine compounds such as N-phenylglycine, 2-mercapto-N-phenylbenzimidazole, and mercapto compounds such as mercaptopropionic acid ester.

The sensitizing dye is a compound that is excited by absorbing light having a specific wavelength to show an interaction with the photopolymerization initiator (component B). It should be noted that the term "interaction" as used herein refers to, for example, the transfer of energy from the sensitizing dye in an excited state or the transfer of an electron therefrom.

A known, commonly used compound may be used as the sensitizing dye. Specific examples thereof include, but not limited to, an anthracene derivative, an anthraquinone derivative, a pyrene derivative, a perylene derivative, a carbazole derivative, a benzophenone derivative, a thioxanthone derivative, a xanthone derivative, a thioxanthone derivative, a coumarin derivative, a phenothiazine derivative, a camphorquinone derivative, an acridine-based dye, a thiopyrylium salt-based dye, a merocyanine-based dye, a quinoline-based dye, a styrylquinoline-based dye, a ketocoumarin-based dye, a thioxanthene-based dye, a xantnene-based dye, a oxonol-based dye, a cyanine-based dye, a rhodamine-based dye, and a pyrylium salt-based dye.

One kind of the sensitizers may be used alone or two or more kinds thereof may be used as a mixture.

In the present invention, the content of the sensitizer in the photocurable composition is preferably 0 wt % to 20 wt % with respect to the total amount of the polymerizable monomer (component A). In addition, the content is more preferably 0.1 wt % to 5.0 wt %, still more preferably 0.2 wt % to 2.0 wt %. Here, when the content of the sensitizer is set to 0.1 wt % or more, an effect of the sensitizer can be expressed in an additionally effective fashion. Meanwhile, when the content of the sensitizer is controlled to 5 wt % or less, a compound (polymer) to be obtained by a photo-curing reaction has a sufficiently high molecular weight, and its dissolution failure and the deterioration of its storage stability can be suppressed.

(1-5) Condition for Compounding Photocurable Composition

Upon actual preparation of the photocurable composition, the photocurable composition can be prepared by mixing the respective components. Here, the mixing and dissolution of the photocurable composition are typically performed in the temperature range of 0° C. to 100° C.

A solvent to be used upon preparation of the photocurable composition is not particularly limited as long as the solvent does not undergo any phase separation with the polymerizable polymer.

(1-6a) Physical Properties of Composition-Viscosity

In the photocurable composition to be used in the manufacturing method of the present invention, the viscosity of the composition itself is preferably 1 cP to 100 cP at 23° C. in a mixture of the components except the solvent. The viscosity is more preferably 5 cP to 50 cP, still more preferably 6 cP to 20 cP. Here, when the viscosity is higher than 100 cP, it may require a long time period to charge the composition into a recessed portion of a fine pattern on the mold in the imprinting step to be described later, or a pattern defect may occur owing to a failure in the charging. On the other hand, when the viscosity is lower than 1 cP, application unevenness may occur in an applying step to be described later or the composition may flow out of an end portion of the mold in the imprinting step to be described later.

(1-6b) Physical Properties of Composition-Surface Tension

In the photocurable composition to be used in the manufacturing method of the present invention, the surface tension of the composition itself is preferably 5 mN/m to 70 mN/m at 23° C. in the mixture of the components except the solvent. The surface tension is more preferably 7 mN/m to 35 mN/m, still more preferably 10 mN/m to 32 mN/m. Here, when the surface tension is lower than 5 mN/m, it requires a long time period to charge the composition into the fine pattern on the surface of the mold in the imprinting step to be described later. On the other hand, when the surface tension is higher than 70 mN/m, the surface smoothness of the composition reduces.

(1-6c) Physical Properties of Composition-Particle

In the photocurable composition to be used, in the manufacturing method of the present invention, a particle responsible for the occurrence of a pattern defect is desirably prevented from being included in the composition. Accordingly, after the preparation of the photocurable composition, the composition is preferably filtered through, for example, a filter having a pore diameter of 0.001 µm to 5.0 µm. It should be noted that upon performance of the filtration, the filtration is more preferably performed in multiple stages or repeated multiple times. Alternatively, a filtered liquid may be filtered again. Here, a polyethylene resin, a polypropylene resin, a fluororesin, a nylon resin, or the like can be used as a material for the filter to be used in the filtration, though the material is not particularly limited in the present invention.

(1-6d) Physical Properties of Composition-Metal Impurity

Upon use of the photocurable composition to be used in the present invention for the manufacture of a semiconductor integrated circuit, the amount of a metal impurity to be included in the composition is preferably reduced to the extent possible in order that the operation of the semiconductor integrated circuit as a product may not be inhibited. Accordingly, in the photocurable composition to be used in the present invention, the concentration of the metal impurity that can be incorporated into the composition is set to preferably 10 ppm or less, more preferably 100 ppb or less.

(2) Applied Film-Forming Step

Next, the step of applying the photocurable composition onto the substrate to form an applied film (applied film-forming step) is performed. In the step (applied film-forming step), as illustrated in FIG. 1A, an applied film formed of the photocurable composition, i.e., the layer 10 to be subjected to shape transfer is formed on the substrate to be processed (substrate 2).

A silicon wafer is generally used for the substrate to be processed, but a material for the substrate is not limited to this. In addition to the silicon wafer, there may be used a material arbitrarily selected from any known materials for a substrate of a semiconductor device such as aluminum, a titanium-tungsten alloy, an aluminum-silicon alloy, an aluminum-copper-silicon alloy, silicon oxide, and silicon nitride. It should be noted that, as the substrate to be used (substrate to be processed), there may be used a substrate whose adhesion property to a photocurable composition is improved by virtue of a surface treatment such as a silane coupling treatment, a silazane treatment, or a film formation of an organic thin film.

As a method of applying the photocurable composition prepared in the step of preparing the photocurable composition onto the substrate to be processed, there may be used an ink jet method, a dip coating method, an air knife coating method, a curtain coating method, a wire bar coating method, a gravure coating method, an extrusion coating method, a spin coating method, or a slit scan method. It should be noted that the thickness of the layer 10 to be subjected to shape transfer (applied film) varies depending on the application, and is, for example, 0.01 µm to 100.0 µm.

(3) Imprinting Step

Next, the step of bringing the mold into contact with the applied film formed in the preceding step (applied film-forming step) (imprinting step, FIG. 1B-1, FIG. 1B-2) is performed. When the mold 3 is brought into contact with the layer 10 to be subjected to shape transfer in the step (imprinting step) (FIG. 1B-1), a recessed portion of the fine pattern formed on the mold 3 is charged with (part of) the applied film 10 (FIG. 1B-2).

The mold 3 to be used in the imprinting step needs to be constituted of an optically transparent material in consideration of the next step (photoirradiation step). Glass, quartz, an optically transparent resin such as a PMMA or a polycarbonate resin, a transparent metal-deposited film, a flexible film made of a polydimethylsiloxane or the like, a photo-cured film, and a metal film can be given as specific examples of the constituent material for the mold. It should be noted that when an optically transparent resin is used as the constituent material for the mold, a resin that does not dissolve in the solvent in the photocurable composition 1 needs to be selected.

The mold 3 to be used in the method of manufacturing a film of the present invention may be subjected to a surface treatment for improving releasability between the photocurable composition 1 and the surface of the mold 3 before use. A method for the surface treatment is as described below. The treatment is performed with, for example, a silicone- or fluorine-based silane coupling agent. Specifically, a commercially available application type mold release agent such as an OPTOOL DSX manufactured by Dai ten Industries, Ltd, can be suitably used.

The pressure to be applied to the layer 10 to be subjected to shape transfer when the mold 3 is brought info contact with the layer 10 to be subjected to shape transfer as illustrated in FIG. 1B-1 in the imprinting step is typically 0.1 MPa to 100 MPa, though the pressure is not particularly limited. Of such range, a pressure of 0.1 MPa to 50 MPa is preferred, a pressure of 0.1 MPa to 30 MPa is more preferred, and a pressure of 0.1 MPa to 20 MPa is still more preferred. In addition, the time period for which the mold 3 is brought into contact with the layer 10 to be subjected to shape transfer in the imprinting step is typically 1 second to 600 seconds, preferably 1 second to 300 seconds, more preferably 1 second to 180 seconds, particularly preferably 1 second to 120 seconds, though the time period, is not particularly limited.

In addition, the imprinting step can be performed under any one of the following conditions; under an air atmosphere, under a reduced-pressure atmosphere, and under an inert gas atmosphere. When the imprinting step is performed, under an inert gas atmosphere, specific examples of the inert gas to be used include nitrogen, carbon dioxide, helium, argon, various chlorofluorocarbon gases, and a mixed gas thereof.

Here, the imprinting step is preferably performed under an atmosphere having a pressure in the range of 0.0001 atmosphere to 10 atmospheres.

In addition, the imprinting step is preferably performed under a reduced-pressure atmosphere or an inert gas atmosphere because an influence of oxygen or moisture on the photo-curing reaction can be prevented.

(4) Photoirradiation Step

Next, the step of irradiating toe applied film with light through the mold (photoirradiation step, FIG. 1C) is performed. In the step, a gas is generated by the photoreaction of the component C in the photocurable composition while the applied film is cured with the applied light to form the cured film 11.

Figure 2A:
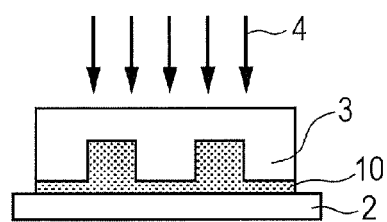
Figure 2A:
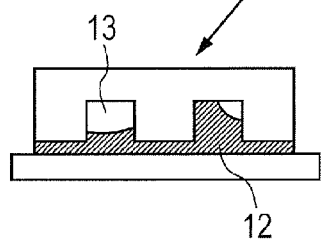
Figure 2A:
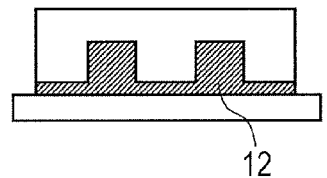
Figure 2A:
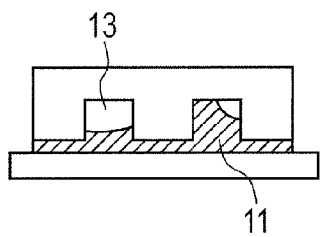
Figure 2A:
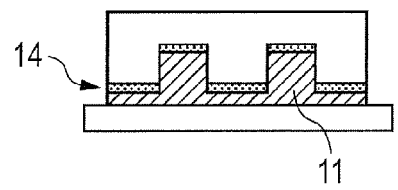
Figure 2A:
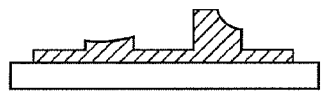
Figure 2A:
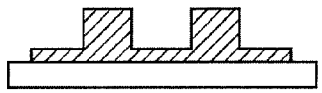

FIGS. 2A, 2B-1, 2B-2, 2C-1, 2C-2, 2D-1 and 2D-2 are schematic sectional views illustrating the details of the step (photoirradiation step). As illustrated in FIG. 1C and FIG. 2A, the photoirradiation step is the step of exposing the layer 10 to be subjected to shape transfer formed of the photocurable composition to the light (irradiating the layer with the irradiation light 4) through the mold 3 in a state where the layer 10 to be subjected to shape transfer and the mold 3 are brought into contact with each other.

Here, when the layer 10 to be subjected to shape transfer is exposed to the light, chemical reactions described in the following items (4a) and (4b) occur simultaneously or competitively in the layer 10 to be subjected to shape transfer: (4a) the polymerization reaction of the polymerizable monomer; and (4b) the photoreaction (photodegradation) of the photosensitive gas generator.

It is assumed that emphasis has to be placed only on the polymerization reaction described in the item (4a) in consideration only of the formation of the film. However, when the polymerizable monomer is merely polymerized, part of the pattern of the film may be broken by a release force occurring between the film and the mold 3 upon release of the mold 3 from the film in the releasing step to be subsequently performed. In view of the foregoing, the gas is generated from the photosensitive gas generator (component C) in the photocurable composition by the photodegradation described in the item (4b). The gas generated here can reduce the release force that is of concern in the releasing step to be described later.

However, the polymerization reaction described in the item (4a) and the photodegradation described in the item (4b) occur simultaneously or competitively in the layer 10 to be subjected to shape transfer. Accordingly, the gas generated by the photodegradation described in the item (4b) may be responsible for the breakage of part of the pattern of the film unless those two reactions are controlled well.

In view of the foregoing, in the present invention, in the step (photoirradiation step), the reaction rate of the polymerization reaction of the polymerizable monomer in the photocurable composition is controlled so as to be higher than the reaction rate of the gas-generating reaction of the photosensitive gas generator in the photocurable composition.

An action and an effect when the reaction rate can be controlled as described above are described with reference to FIGS. 2A, 2B-1, 2B-2, 2C-1, 2C-2, 2D-1 and 2D-2. It should be noted that in the following description, the reaction rate of the polymerization reaction described in the item (4a) is represented by $V_1$ and the reaction rate of the photodegradation described in the item (4b) is represented by $V_2$.

Here, in the case of $V_1 < V_2$, in a state where the curing of the layer 10 to be subjected to shape transfer progresses to provide a so-called semi-cured film 12, the gas is generated by the photodegradation in a considerable amount to diffuse from the semi-cured film 12. As a result, an air bubble 13 is generated between the semi-cured film 12 and the mold 3 (FIG. 2B-1). Even after the layer 10 to be subjected to shape transfer has been brought into the state of the cured film 11, the air bubble 13 remains between the cured film 11 and the mold 3 (FIG. 2C-1), and is responsible for a defect in the pattern of the cured film 11 when the mold 3 is released from the cured film 11 (FIG. 2D-1).

On the other hand, in the case of $V_1 > V_2$, in a state where the layer 10 to be subjected to shape transfer is turned into the semi-cured film 12, the amount of the gas generated by the pnotodegradation is, if not zero, such a trace amount that no air bubble occurs between the semi-cured film 12 and the mold 3 (FIG. 2B-2). In addition, in a state where the curing of the layer 10 to be subjected to shape transfer progresses to provide the cured film 11, the gas is generated by the pnotodegradation in a considerable amount. Meanwhile, the curing of the layer 10 to be subjected to shape transfer progresses rapidly. Accordingly, the gas generated by the photodegradation does not diffuse from the cured film 11 to the outside but uniformly disperses in the cured film 11. Here, when the mold 3 is slightly released from the cured film 11, the pressing force of the mold 3 against, the cured film 11 reduces and hence the gas 14 uniformly dispersed in the cured film 11 diffuses from the cured film 11 (FIG. 2C-2). It should be noted that at the time point of FIG. 2C-2, the cured film 11 has a sufficient strength, and hence the cured film 11 does not deform owing to the diffusion of the gas 14 and the pattern of the cured film 11 is still maintained at the stage of the completion of the releasing step (FIG. 2D-2). When the manufacturing method of the present invention is utilized as described above, a film having a desired pattern can be obtained without the breakage of part of the pattern.

By the way, the reaction rate $V_1$ or the polymerization reaction of the polymerizable monomer is determined by a combination of the polymerizable monomer (component A) and the photopolymerization initiator (component B), and a combination with the sensitizer or the antioxidant. In addition, the reaction rate $V_1$ becomes higher as the molar extinction coefficient of the photopolymerization initiator (component B) for light having a specific wavelength increases.

Meanwhile, the reaction rate $V_2$ of the photodegradation of the photosensitive gas generator is determined by reactivity inherent in the substance. In addition, the reaction rate $V_2$ becomes higher as the molar extinction coefficient of the photosensitive gas generator (component C) for light having a specific wavelength increases.

Accordingly, the molar extinction coefficients of the photopolymerization initiator (component B) and the photosensitive gas generator (component C) are desirably measured upon preparation of the photocurable composition. This is because the molar extinction coefficients of the component B and the component C are each one of the important factors that determine the $V_1$ or the $V_2$. Here, the case of $V_1 = V_2$ (including the case of $V_1 \approx V_2$) is not preferred because substantially the same phenomenon as that in the case of $V_1 > V_2$ occurs. On the other hand, in the case of $V_1 > V_2$, a ratio between both the rates preferably falls within a predetermined range. Specifically, the ratio "$V_1 : V_2$" preferably ranges from 2:1 to 1,000:1. When the ratio deviates from the range, part of the film pattern may be damaged by the gas generated from the photosensitive gas generator (component C) or the release force occurring upon release of the film from the mold.

In addition, the light (irradiation light 4) with which the layer 10 to be subjected to shape transfer is irradiated is not particularly limited as long as the following condition is satisfied. The polymerization reaction described in the item (4a) is faster than the photodegradation described in the item (4b). In addition, the light to be applied is not limited to light having a single wavelength and may be broad light having some wavelength region. Here, the kind (the light having a single wavelength, the broad light, or the like) of the irradiation light 4 is desirably examined for the wavelength dependence of the molar extinction coefficient of each of the component B and the component C by means of, for example, an absorption spectrum. It should be noted that light having an error range of 10 nm or less is included in the category of the light having a single wavelength.

Here, the light with which the layer 10 to be subjected to shape transfer is irradiated is selected in accordance with the sensitivity wavelength of the photocurable composition. Specifically, it is preferred that ultraviolet light having a wavelength of about 150 nm to 400 nm, an X-ray, an electron beam, or the like be appropriately selected and used. Here, many of the compounds commercially available as compounds (photosensitive compounds) to be used as the photopolymerization initiator (component B) and the photosensitive gas generator (component C) each have sensitivity to the ultraviolet light. Accordingly, the light with which the layer 10 to be subjected to shape transfer is irradiated (irradiation light 4) is particularly preferably the ultraviolet light. Here, examples of the light source of ultraviolet light include a high-pressure mercury lamp, an ultra-high pressure mercury lamp, a low-pressure mercury lamp, a Deep-UV lamp, a carbon arc lamp, a chemical lamp, a metal halide lamp, a xenon lamp, a KrF excimer laser, an ArF excimer laser, and a $F_2$ excimer laser. Of those, an ultra-high pressure mercury lamp is particularly preferred. The number of the light source to be used may be one or more. Further, when the layer 10 to be subjected to shape transfer is irradiated with light, the entire surface thereof may be irradiated with light, or a part of the surface thereof may be irradiated with light.

(4-1) Method of Measuring Reaction Rate

Hereinafter, a specific example of a method of evaluating each of the reaction rate $V_1$ of the polymerization reaction of the polymerizable monomer and the reaction rate $V_2$ of the photodegradation of the photosensitive gas generator is described with reference to a drawing as appropriate.

Figure 3:
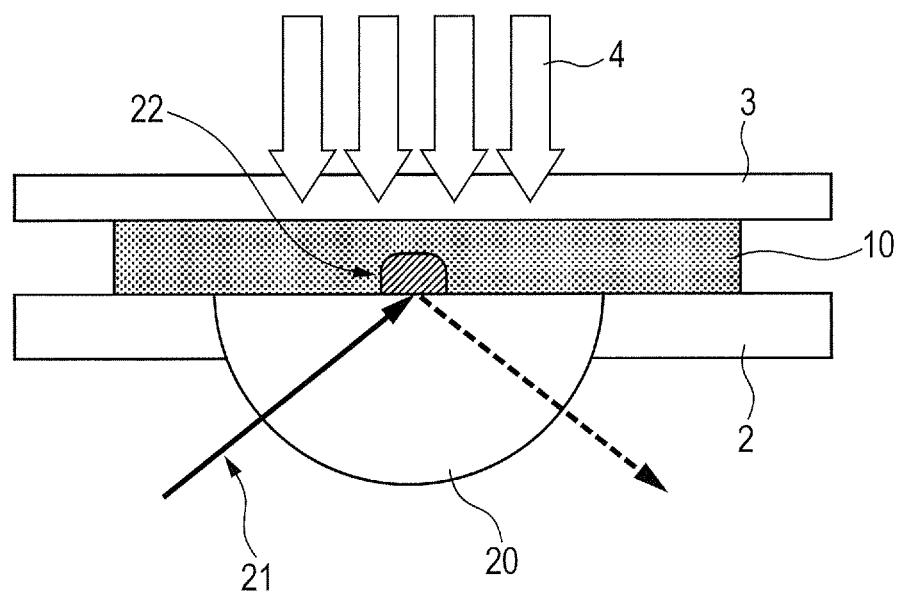
FIG. 3 is a schematic sectional view illustrating a specific example of a measurement sample to be used in a reaction rate-measuring apparatus.

FIG. 3 is a schematic sectional view illustrating a specific example of a measurement sample to be used in a reaction rate-measuring apparatus. It should be noted that FIG. 3 illustrates a reaction rate-measuring apparatus utilizing attenuated total reflection infrared spectroscopy.

Here, the sample of FIG. 3 is such that the layer 10 to be subjected to shape transfer is interposed between the substrate 2 and the mold 3, and the irradiation light 4 (ultraviolet light) is applied from the side of the mold 3 toward the layer 10 to be subjected to shape transfer. When a reaction rate is evaluated with the sample of FIG. 3, the layer 10 to be subjected to shape transfer is irradiated with an infrared ray 21 through a diamond ATR crystal 20 which the substrate 2 has while the irradiation with the irradiation light 4 is performed. As a result, the reaction rate can be measured by acquiring, in real time, infrared spectroscopic spectra to be measured at a pace of several spectra to several tens of spectra per second by means of an evanescent wave 22 occurring from an interface between the substrate 2 and the layer 10 to be subjected to shape transfer toward the layer 10 to be subjected to shape transfer to a depth of several micrometers, (5) Releasing Step Next, the step of releasing the mold from the photocurable composition to form a film having a predetermined pattern shape on the substrate (releasing step, FIG. 1D) is performed. The step (releasing step) is the step of releasing the mold from the layer to be subjected to shape transfer, and the reverse pattern of the fine pattern formed on the mold in the preceding step (photoirradiation step) is obtained as the pattern of she cured photocurable composition.

A method of releasing the mold 3 from the cured applied film (cured film 11) is not particularly limited as long as part of the cured film 11 does not physically fracture during the release, and various conditions for the release and the like are also not particularly limited. For example, the mold 3 may be released as described below. The substrate to be processed (substrate 2) is fixed and the mold is moved so that the mold may go away from the substrate to be processed. Alternatively, the mold 3 may be released as described below. The mold is fixed and the substrate to be processed is moved so that the substrate may go away from the mold. Alternatively, the mold may be released by pulling both the substrate and the mold in directions diametrically opposed to each other.

A method involving releasing the mold 3 from the cured film 11 with an application type mold release agent can also be adopted. Here, in order that the mold 3 may be released from the cured film 11 with the application type mold release agent, the step of forming an application type mold release agent layer on the surface of the mold having a desired pattern is performed before the imprinting step.

When the application type mold release agent is used, examples of the kind thereof, which is not particularly limited, include a silicone-based mold release agent, a fluorine-based mold release agent, a polyethylene-based mold release agent, a polypropylene-based mold release agent, a paraffin-based mold release agent, a montan-based mold release agent, and a carnauba-based mold release agent. It should be noted that one kind of those mold release agents may be used alone, or two or more kinds thereof may be used in combination. Of those, the fluorine-based mold release agent is particularly preferred.

(6) Residual Film-Removing Step

Although the film to be obtained when the releasing step is performed has a specific pattern shape, part of the film may exist as a residual film even in a region except the region where the pattern shape is formed. In view of the foregoing, the step of removing the photocurable composition (residual film) remaining in a region from which the photocurable composition should be removed out of the pattern shape (residual film-removing step, FIG. 1E) is performed.

Here, a method of removing the residual film is, for example, a method involving removing the film (residual film 15) remaining in a recessed portion of the applied film by etching to expose the surface of the substrate to be processed in the recessed portion of the pattern.

When the etching is utilized, a specific method therefor is not particularly limited and a desired pattern shape can be formed by a conventionally known method, for example, by performing dry etching. A conventionally known dry etching apparatus can be used in the dry etching. In addition, a source gas at the time of the dry etching is appropriately selected depending on the elemental composition of a film to be etched. For example, a gas containing an oxygen atom such as $O_2$, CO, or $CO_2$, an inert gas such as He, $N_2$, or Ar, a chlorine-based gas such as $Cl_2$ or $BCl_3$, or a gas of $H_2$ or $NH_3$ can be used. It should be noted that those gases can be used as a mixture.

The photo-cured product 11 having a desired irregular-pattern shape (pattern shape attributable to the irregular shape of the mold 3) can be obtained by the manufacturing process including the steps (1) to (6). Here, when the substrate 2 is processed by utilizing the photo-cured product 11, the step of processing the substrate to be described later is further performed in some cases.

Meanwhile, the resultant photo-cured product 11 can be utilized as an optical element (the case where the product is used as one member of the optical element is included). In such case, the photo-cured product 11 can be provided as an optical component having at least the substrate 2 and the photo-cured product 11 placed on the substrate 2.

(7) Substrate-Processing Step (FIG. 1F)

The photo-cured product 11 having a desired irregular pattern shape obtained by the manufacturing method of the present invention can be utilized as, for example, a film for an interlayer insulating film in an electronic component typified by a film for an interlayer insulating film of a semiconductor element such as an LSI, a system LSI, a DRAM, an SDRAM, an RDRAM, or a D-RDRAM. Meanwhile, the photo-cured product 11 can be utilized as, for example, a resist film at the time of the manufacture of a semiconductor element.

When the photo-cured product 11 is utilized as a resist film, specifically, part of the substrate whose surface has been exposed by the etching step (region represented by reference numeral 16) is subjected to, for example, etching or ion implantation as illustrated in FIG. 1F. It should be noted that at this time, the photo-cured product 11 functions as a mask. Thus, a circuit 23 based on the pattern shape of the photo-cured product 11 can be formed on the substrate 2. Thus, a substrate with a circuit to be utilized in a semiconductor element, or the like can be manufactured. It should be noted that an electronic component is formed by providing an electronic member for the substrate with a circuit.

It should be noted that when the substrate with a circuit or the electronic component is produced, the pattern of the photo-cured product may be finally removed from the processed substrate, but such a constitution that the pattern is left as a member for constituting an element is also preferred.

Hereinafter, the present invention is described in detail by way of examples, but the present invention is not limited to the examples to be described below.

Example 1

A film having a pattern shape was formed by the following method.

(1) Photocurable Composition

The following reagents and a solvent were mixed.

(A) 1,6-Hexanediol diacrylate (HDODA, manufactured by OSAKA ORGANIC CHEMICAL INDUSTRY LTD.): 100 parts by weight (B) Irgacure 369 (manufactured, by Ciba Japan): 3 parts by weight (C) p-Cresol 1,2-naphthoquinonediazide-5-sulfonate (PC-5, manufactured by Toyo Gosei Co., Ltd.): 2 parts by weight Next, the mixed liquid was filtered through a 0.2-μm filter made of tetrafluoroethylene. Thus, a photocurable composition was prepared.

(2) Step of Applying Photocurable Composition

About 10 μL of the photocurable composition prepared in the section (1) were taken and then dropped onto a diamond ATR crystal on an attenuated total reflection infrared spectroscopic apparatus to form an applied film.

(3) Imprinting Step

Next, the top of the applied film formed in the section (2) was covered with a quartz glass having a thickness of 1 mm. Thus, the sample illustrated in FIG. 3, i.e., a sample formed of the applied film formed of the photocurable composition 1 and the quartz glass (mold 3) was obtained on the diamond ATR crystal (substrate 2).

(4) Photoirradiation Step

Next, the sample was irradiated with light emitted from a UV light source EX250 provided with a 250-W ultra-high pressure mercury lamp (manufactured by HOYA CANDEO OPTRONICS CORPORATION) from above the quartz glass for 10 seconds after the light had been passed through an interference filter to be described later. It should be noted that the interference filter used during the photoirradiation was a VPF-25C-10-15-31300 (manufactured by SIGMA KOKI CO., LTD.), and at this time, the ultraviolet light as irradiation light was light having a single wavelength of 313±5 nm and its illumination intensity was set to 1 mW/cm². In addition, in the photoirradiation step, the diminution rate of an acrylic group in the component (A) constituting the photocurable composition (the reaction rate of the polymerization reaction of the component (A)) and the diminution rate of an azide group in the component (C) (the reaction rate of the elimination reaction of nitrogen by the light) were each evaluated by the following method.

(4-1) Evaluation for Diminution Rate (Reaction Rate) of Specific Functional Group by Infrared Spectroscopy The measurement of an attenuated total reflection infrared spectroscopic spectrum was initiated simultaneously with the initiation of the irradiation of the sample with the light. Data was acquired by performing the measurement 2.7 times per second while continuing the photoirradiation.

Figure 4:
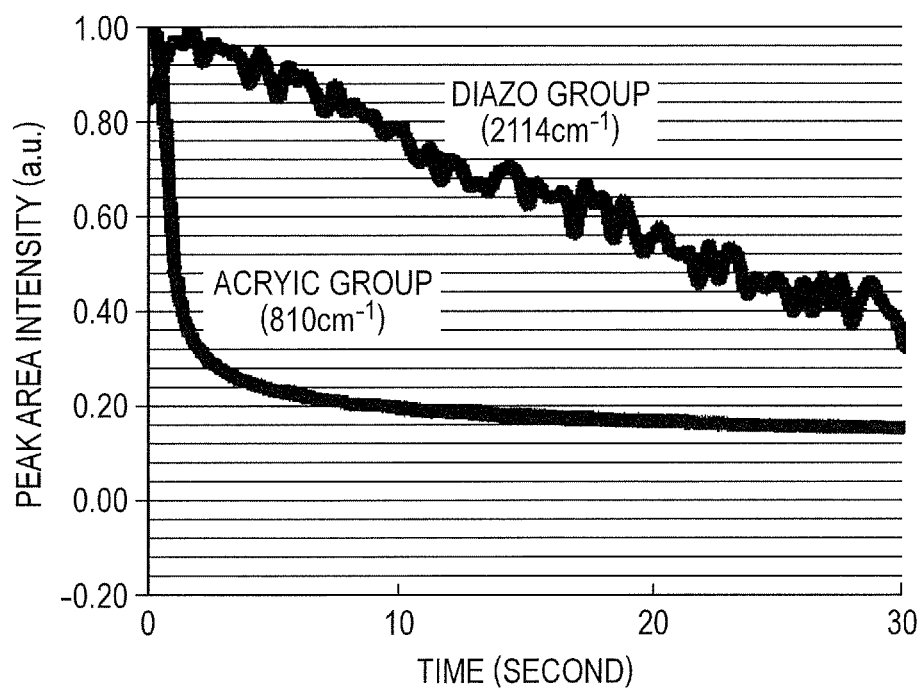
FIG. 4 is a view illustrating the results of the measurement of an attenuated total reflection infrared spectroscopic spectrum in Example 1.

FIG. 4 is a view illustrating the results of the measurement of the attenuated total reflection infrared spectroscopic spectrum in this example. Here, FIG. 4 illustrates a graph of changes over time of the peak area intensities of a peak (a1) at 810 cm$^{-1}$ derived from an acrylic group of the HDODA as the component (A) and a peak at 2114 cm$^{-1}$ derived from an diazo group derived from the PC-5 as the component (C). It should be noted that FIG. 4 illustrates each of the peak area intensities as a relative value when an initial value immediately after the initiation of the photoirradiation is defined as 1. FIG. 4 showed that the diminution rate of the polymerizable functional group (acrylic group) was higher than the diminution rate of the gas-generating functional group (azide group; under the conditions of this example.

(5) Formation of Film

The photocurable composition described in the section (1) is applied to the substrate 2 as illustrated in FIG. 1A. Thus, an applied film formed of the photocurable composition 1 is formed. After the mold 3 having a predetermined pattern has been placed on the applied film, the applied film is irradiated with light through the mold 3. After that, the mold 3 is released. Thus, a film having a predetermined pattern shape can be obtained. In addition, the pattern shape can be evaluated by observing the produced film (resin thin film) with an electron microscope.

Example 2

(1) Photocurable Composition

The following reagents and a solvent were mixed.
(A) 1,6-Hexanediol diacrylate (HDODA, manufactured by OSAKA ORGANIC CHEMICAL INDUSTRY LTD.): 100 parts by weight
(B) 2-Hydroxy-2-methyl-1-phenyl-propan-1-one (Darocur 1173, manufactured by Ciba Japan): 3 parts by weight.
(C) Bis(2,4-dimethylphenylsulfonyl)diazomethane (DAM-105, manufactured by Midori Kagaku Co., Ltd.): 3 parts by weight Next, the mixed liquid was filtered through a 0.2-μm filter made of tetrafluoroethylene. Thus, a photocurable composition was prepared.

(2) Step of Applying Photocurable Composition

The step was performed in the same manner as in Example 1.

(3) Imprinting Step

The step was performed in the same manner as in Example 1.

(4) Photoirradiation Step

The step was performed in the same manner as in Example 1.

Figure 5:
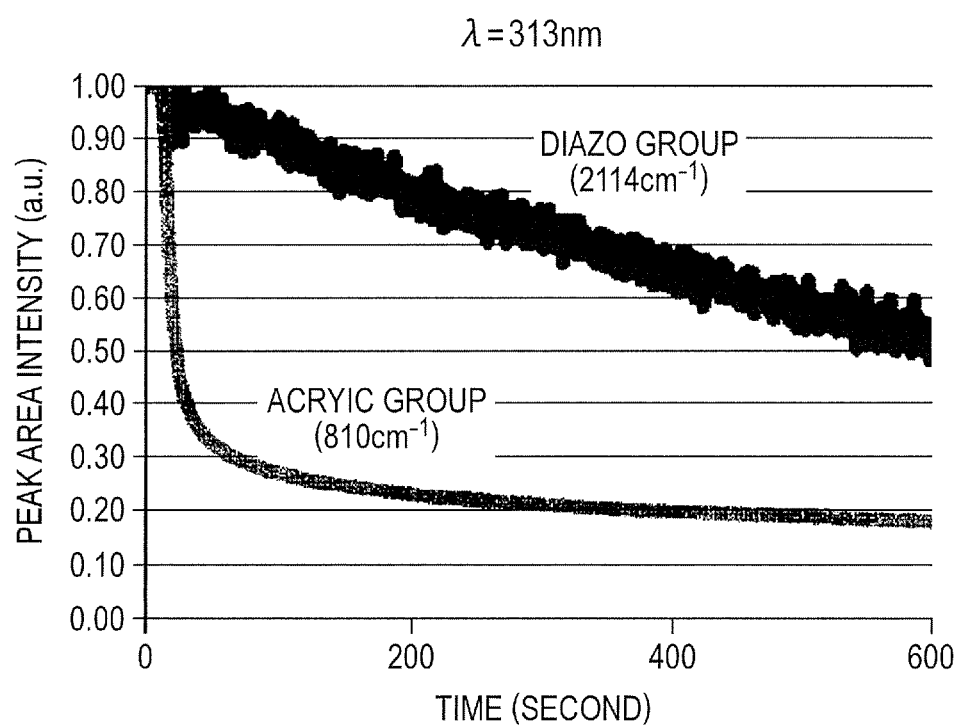
FIG. 5 is a view illustrating the results of the measurement of an attenuated total reflection infrared spectroscopic spectrum in Example 2.

(4-1) Evaluation for Diminution Rate (Reaction Rate) of Specific Functional Group by Infrared Spectroscopy The evaluation was performed in the same manner as in Example 1. FIG. 5 is a view illustrating the results of the measurement of the attenuated total reflection infrared spectroscopic spectrum in this example. Here, FIG. 5 illustrates a graph of changes over time of the peak area intensities of a peak (a1) at 810 cm$^{-1}$ derived from an acrylic group of the HDODA as the component (A) and a peak at 2114 cm$^{-1}$ derived from a diazo group derived from the DAM-105 as the component (C). It should be noted that FIG. 5 illustrates each of the peak area intensities as a relative value when an initial value immediately after the initiation of the photoirradiation is defined as 1. FIG. 5 showed that the diminution rate of the polymerizable functional group (acrylic group) was higher than the diminution rate of the gas-generating functional group (diazo group) under the conditions of this example.

(5) Formation of Film

The formation can be performed in the same manner as in Example 1.

Example 3

(1) Photocurable Composition

The same photocurable composition as that of Example 2 was prepared by the same method as that of Example 2.

(2) Step of Applying Photocurable Composition

The step was performed in the same manner as in Example 1.

(3) Imprinting Step

The step was performed in the same manner as in Example 1.

(4) Photoirradiation Step

A film (resin thin film) was obtained by the same method, as that of Example 1 except that the interference filter used in the section (4) of Example 1 was changed to a VPF-25C-10-23-36300 (manufactured by SIGMA KOKI CO., LTD.). It should be noted that in this comparative example, the irradiation light had a wavelength of 365±5 nm and an illumination intensity of 1 mW/cm$^2$.

Figure 6:
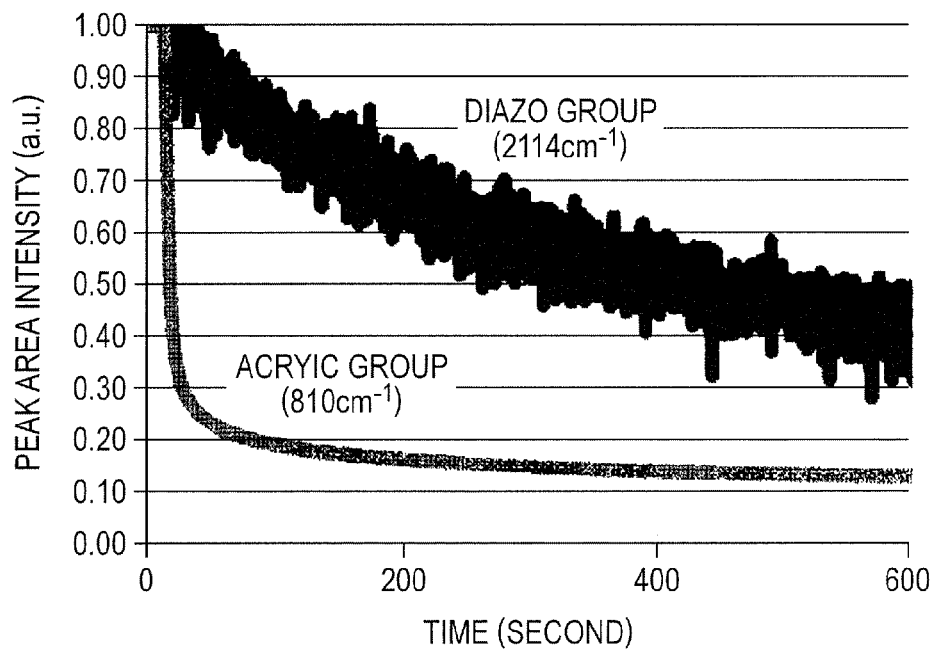
FIG. 6 is a view illustrating the results of the measurement of an attenuated total reflection infrared spectroscopic spectrum in Example 3.

(4-1) Evaluation for Diminution Rate (Reaction Rate) of Specific Functional Group by Infrared Spectroscopy The evaluation was performed in the same manner as in Example 1. FIG. 6 is a view illustrating the results of the measurement of the attenuated total reflection infrared spectroscopic spectrum in this example. Here, FIG. 6 illustrates a graph of changes over time of the peak area intensities of a peak (a1) at 810 cm$^{-1}$ derived from an acrylic group of the HDODA as the component (A) and a peak at 2114 cm$^{-1}$ derived from a diazo group derived from the DAM-105 as the component (C). It should be noted that FIG. 6 illustrates each of the peak area intensities as a relative value when an initial value immediately after the initiation of the photoirradiation is defined as 1. FIG. 6 showed that the diminution rate of the polymerizable functional group (acrylic group) was higher than the diminution rate of the gas-generating functional group (diazo group) under the conditions of this example.

(5) Formation of Film

The formation can be performed in the same manner as in Example 1.

Example 4

(1) Photocurable Composition

The following reagents and a solvent were mixed.

(A) Isobornyl acrylate (IBOA, manufactured by KYOE-ISHA CHEMICAL Co., LTD): 61.6 parts by weight, 1,6-hexanediol diacrylate (HDODA, manufactured by OSAKA ORGANIC CHEMICAL INDUSTRY LTD.): 22.4 parts by weight, and Medo110 (manufactured by OSAKA ORGANIC CHEMICAL INDUSTRY LTD.): 10 parts by weight (B) 2-Hydroxy-2-methyl-1-phenyl-propan-1-one (Darocur 1173, manufactured by Ciba Japan): 3 parts by weight (C) Hexa(ethylene oxide)monomethyl ether 12-(2-diazo-1,2-naphthoquinone-5-sulfonylamino)dodecanoate (NIT-29, manufactured by NARD institute, Ltd.): 5 parts by weight Next, the mixed liquid was filtered through a 0.2-μm filter made of tetrafluoroethylene. Thus, a photocurable composition was prepared.

(2) Step of Applying of Photocurable Composition

The step was performed in the same manner as in Example 1.

(3) Imprinting Step

The step was performed in the same manner as in Example 1.

(4) Photoirradiation Step

A film (resin thin film) was obtained by the same method as that of Example 1 except that the interference filter used in the section (4) of Example 1 was changed to a VPF-25C-10-12-25370 (manufactured by SIGMA KOKI Co., LTD.). It should be noted that in this example, the irradiation light had a wavelength of 254±5 nm and an illumination intensity of 1 mW/cm$^2$.

Figure 7:
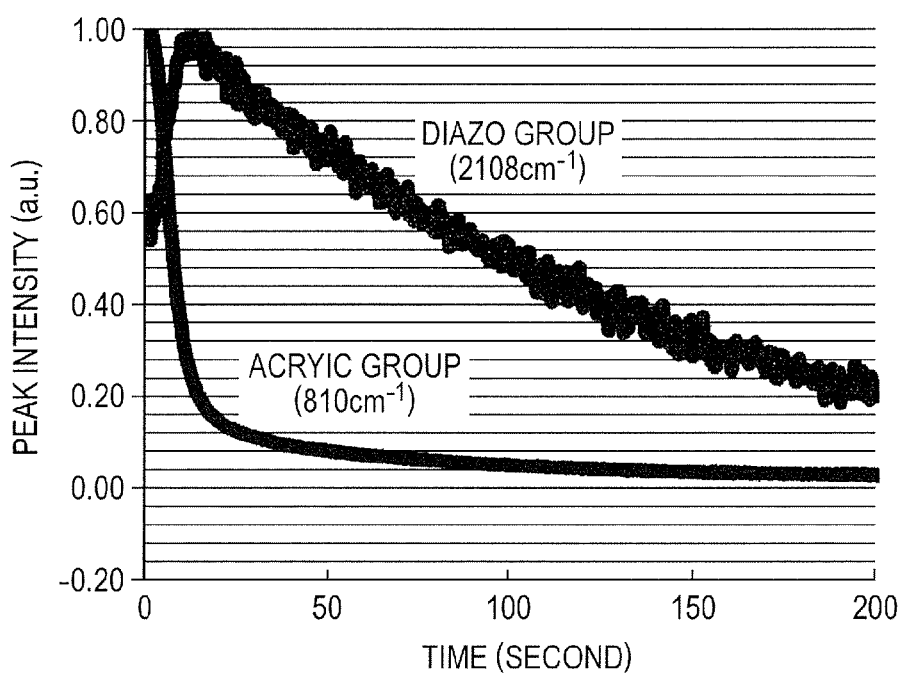
FIG. 7 is a view illustrating the results of the measurement of an attenuated total reflection infrared spectroscopic spectrum in Example 4.

(4-1) Evaluation for Diminution Rate (Reaction Rate) of Specific Functional Group by Infrared Spectroscopy The evaluation was performed in the same manner as in Example 1. FIG. 7 is a view illustrating the results of the measurement of the attenuated total reflection infrared spectroscopic spectrum in this example. Here, FIG. 7 illustrates a graph of changes over time of the peak intensities of a peak (a1) at 810 cm$^{-1}$ derived from an acrylic group of the IBOA, HDODA, and Medo110 as the component (A) and a peak at 2108 cm$^{-1}$ derived from a diazo group derived from the NIT-29 as the component (C). It should be noted that FIG. 7 illustrates each of the peak intensities as a relative value when the maximum value of the peak intensities is defined as 1. FIG. 7 showed that the diminution rate of the polymerizable functional group (acrylic group) was higher than the diminution rate of the gas-generating functional group (diazo group) under the conditions of this example. It should be noted that the NIT-23 has the following structural formula.

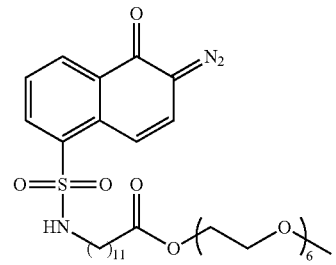

Chem. 1

(5) Formation of Film

The formation can be performed in the same manner as in Example 1.

Example 5

(1) Photocurable Composition

The following reagents and a solvent were mixed.

(A) Isobornyl acrylate (IBOA, manufactured by KYOE-ISHA CHEMICAL Co., LTD): 61.6 parts by weight, 1,6-hexanediol diacrylate (HDODA, manufactured by OSAKA ORGANIC CHEMICAL INDUSTRY LTD.): 22.4 parts by weight, and Medo110 (manufactured by OSAKA ORGANIC CHEMICAL INDUSTRY LTD.); 10 parts by weight (B) 2-Benzyl-2-dimethylamino-1-(4-morpholinophenyl)-butanone-1 (Irgacure 369, manufactured by Ciba Japan): 3 parts by weight (C) Hexa(ethylene oxide)monomethyl ether 12-(2-diazo-1,2-naphthoquinone-5-sulfonylamino)dodecanoate (NIT-29 manufactured by NARD institute, Ltd.): 10 parts by weight Next, the mixed liquid was filtered through a 0.2-µm filter made of tetrafluoroethylene. Thus, a photocurable composition was prepared.

(2) Step of Applying of Photocurable Composition

The step was performed in the same manner as in Example 1.

(3) Imprinting Step

The step was performed in the same manner as in Example 1.

(4) Photoirradiation Step

The step was performed in the same manner as in Example 1.

Figure 8:
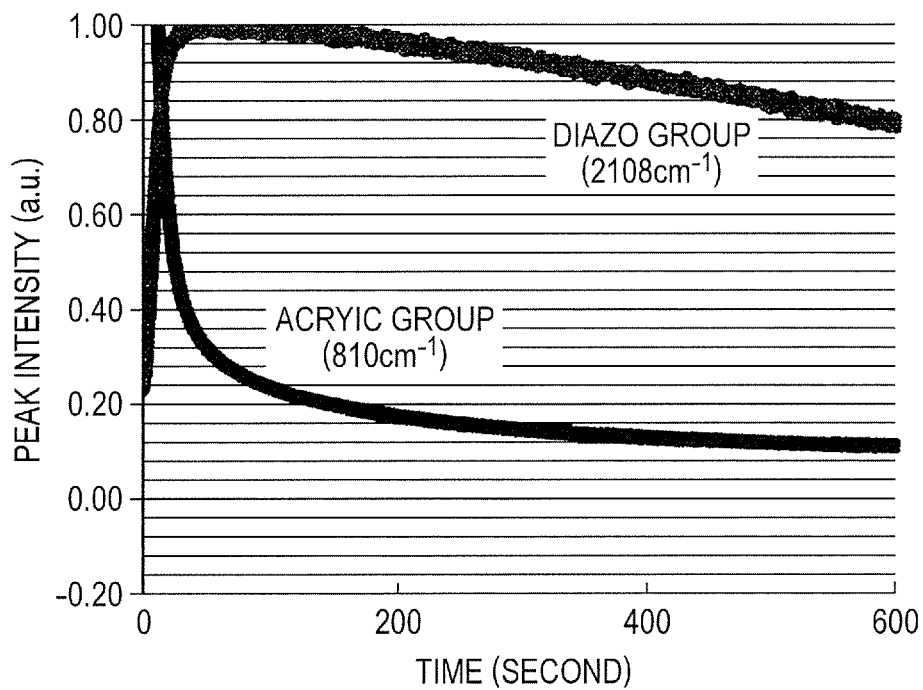
FIG. 8 is a view illustrating the results of the measurement of an attenuated total reflection infrared spectroscopic spectrum in Example 5.

(4-1) Evaluation for Diminution Rate (Reaction Rate) of Specific Functional Group by Infrared Spectroscopy The evaluation was performed in the same manner as in Example 1. FIG. 8 is a view illustrating the results of the measurement of the attenuated total reflection infrared spectroscopic spectrum in this example. Here, FIG. 8 illustrates a graph of changes over time of the peak intensities of a peak (a1) at 810 $cm^{-1}$ derived from an acrylic group of the IBOA, HDODA, and Medo110 as the component (A) and a peak as 2108 $cm^{-1}$ derived from a diazo group derived from the MIT-29 as the component (C). It should be noted that FIG. 8 illustrates each of the peak intensities as a relative value when the maximum value of the peak intensities is defined as 1. FIG. 8 showed that the diminution rate of the polymerizable functional group (acrylic group) was higher than the diminution rate of the gas-generating functional group (diazo group) under the conditions of this example.

(3) Formation of Film

The formation can be performed in the same manner as in Example 1.

Example 6

(1) Photocurable Composition

The same photocurable composition as that of Example 5 was prepared by the same method as that of Example 5.

(2) Step of Applying Photocurable Composition

The step was performed in the same manner as in Example 1.

(3) Imprinting Step

The step was performed in the same manner as in Example 1.

(4) Photoirradiation Step

The step was performed in the same manner as in Example 4.

Figure 9:
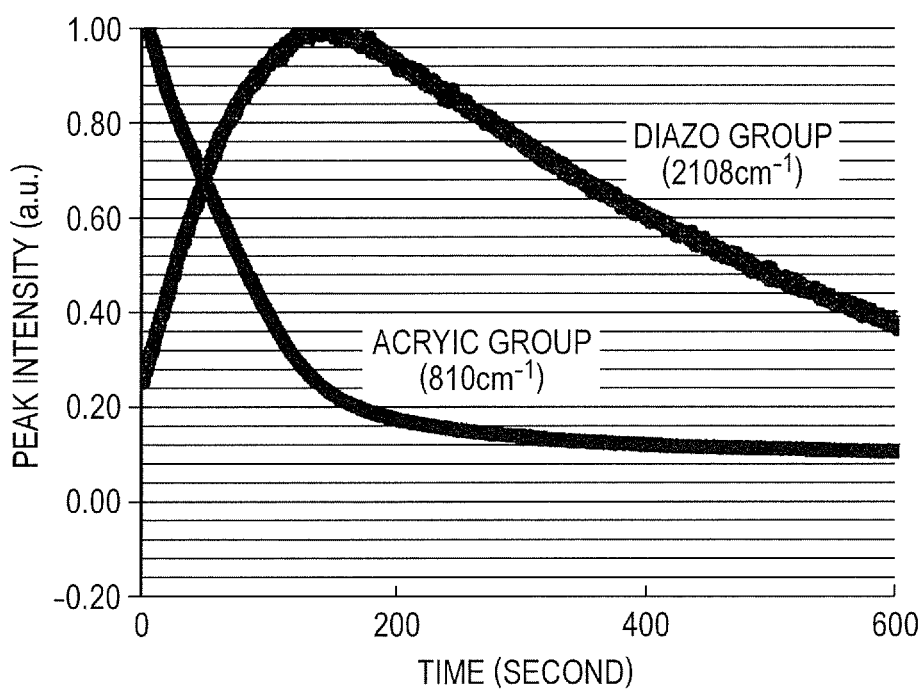
FIG. 9 is a view illustrating the results of the measurement of an attenuated total reflection infrared spectroscopic spectrum in Example 6.

(4-1) Evaluation for Diminution Rate (Reaction Rate) of Specific Functional Group by Infrared Spectroscopy The evaluation was performed in the same manner as in Example 1. FIG. 9 is a view illustrating the results of the measurement of the attenuated total reflection infrared spectroscopic spectrum in this example. Here, FIG. 9 illustrates a graph of changes over time of the peak intensities of a peak (a1) at 810 $cm^{-2}$ derived from an acrylic group of the IBOA, HDODA, and Medo110 as the component (A) and a peak at 2108 $cm^{-1}$ derived from a diazo group derived from the NIT-29 as the component (C). It should be noted that FIG. 9 illustrates each of the peak intensities as a relative value when the maximum value of the peak intensities is defined as 1. FIG. 9 showed that the diminution rate of the polymerizable functional group (acrylic group) was higher than the diminution rate of the gas-generating functional group (diazo group) under the conditions of this example.

(5) Formation of Film

The formation can be performed in the same manner as in Example 1.

Comparative Example 1

A film (resin thin film) was obtained by the same method as that of Example 1 except that the interference filter used in the section (4) of Example 1 was changed to a VPF-25C-10-25-36500 (manufactured by SIGMA KOKI CO., LTD.). Is should be noted that in this comparative example, the irradiation light had a wavelength of 365±5 nm and an illumination intensity of 1 mW/$cm^2$.

Figure 10A:
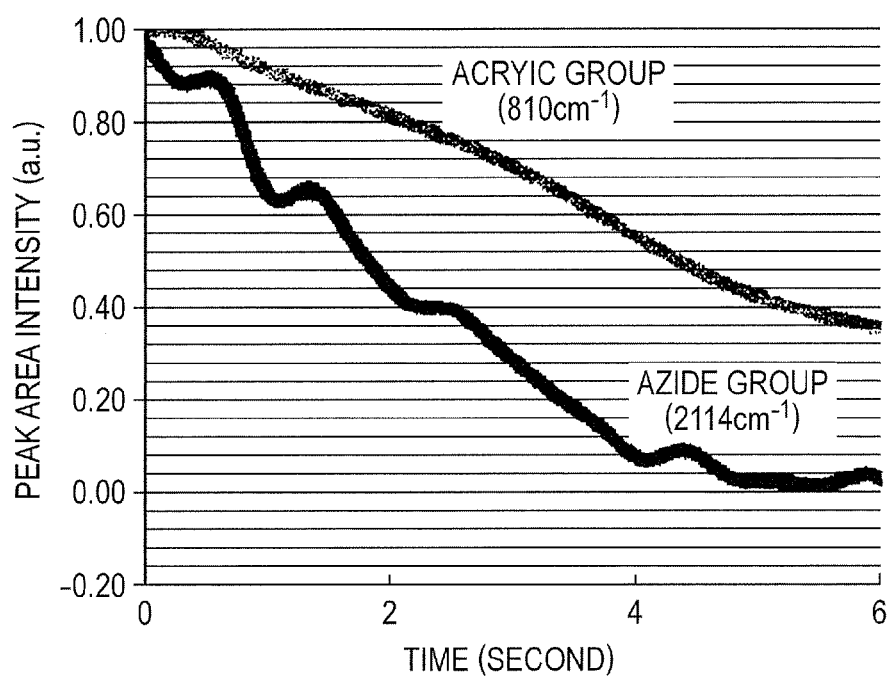
FIGS. 10A, 10B, 10C and 10D are each a view illustrating the results of the measurement of an attenuated total reflection infrared spectroscopic spectrum in each comparative example, FIG. 10A being a view illustrating the results of the measurement of Comparative Example 1, FIG. 10B being a view illustrating the results of the measurement of Comparative Example 2, FIG. 10C being a view illustrating the results of the measurement of Comparative Example 3, and FIG. 10D being a view illustrating the results of the measurement of Comparative Example 4.

FIG. 10A is a view illustrating the results of the measurement of the attenuated total reflection infrared spectroscopic spectrum in this comparative example. FIG. 10A showed that the diminution rate of the polymerizable functional group (acrylic group) was lower than the diminution rate of the gas-generating functional group (diazo group) under the conditions of this comparative example.

Comparative Example 2

A film (resin thin film) was obtained by the same method as that of Example 1 except that the interference filter used in the section (4) of Example 4 was changed to a VPF-25C-10-15-31300 (manufactured by SIGMA KOKI CO., LTD.). If should be noted that in this comparative example, the irradiation light had a wavelength of 313±5 nm and an illumination intensity of 1 mW/$cm^2$.

Figure 10B:
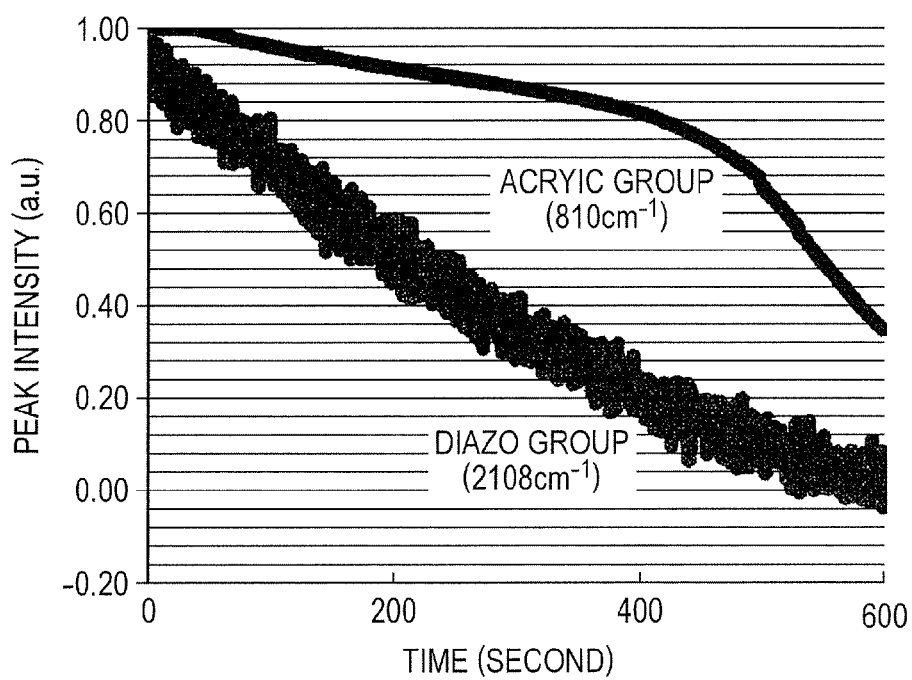

FIG. 10B is a view illustrating the results of the measurement of the attenuated total reflection infrared spectroscopic spectrum in this comparative example. FIG. 10B showed that the diminution rate of the polymerizable functional group (acrylic group) was lower than the diminution rate of the gas-generating functional group (diazo group) under the conditions of this comparative example.

Comparative Example 3

A film (resin thin film) was obtained by the same method as that of Example 1 except that the interference filter used in the section (4) of Example 4 was changed to a VPF-25G-10-25-36500 (manufactured by SIGMA KOKI CO., LTD.).

It should be noted that in this comparative example, the irradiation light had a wavelength of 365±5 nm and an illumination intensity of 1 mW/cm².

Figure 10C:
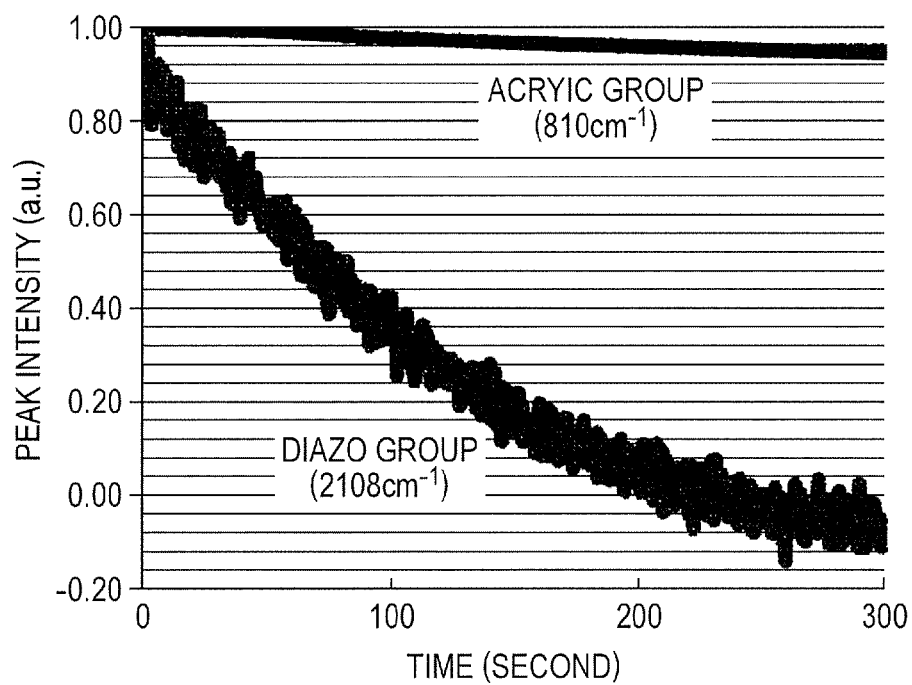

FIG. 10C is a view illustrating the results of the measurement of the attenuated total reflection infrared spectroscopic spectrum in this comparative example. FIG. 10C showed that the diminution rate of the polymerizable functional group (acrylic group) was lower than the diminution rate of the gas-generating functional group (diazo group) under the conditions of this comparative example.

Comparative Example 4

A film (resin thin film) was obtained by the same method as that of Example 1 except that the interference filter used in the section (4) of Example 5 was changed to a VPF-25C-10-25-36500 (manufactured by SIGMA KOKI CO., LTD.). It should be noted that in this comparative example, the irradiation light had a wavelength of 365T5 nm and an illumination intensity of 1 mW/cm².

Figure 10D:
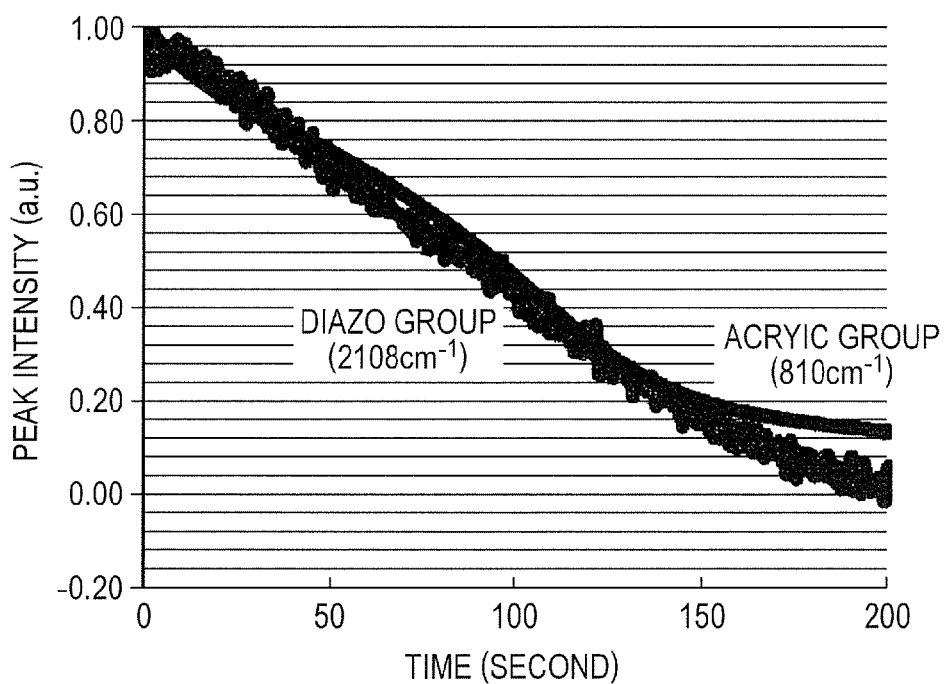

FIG. 10D is a view illustrating the results of the measurement of the attenuated total reflection infrared spectroscopic spectrum in this comparative example. FIG. 10D showed that the diminution rate of the polymerizable functional group (acrylic group) was lower than the diminution rate of the gas-generating functional group (diazo group) under the conditions of this comparative example.

The method of manufacturing a film of the present invention utilizing the photo-nanoimprint method requires a small release force, leads to a small number of bubbling defects, and is excellent in productivity. Accordingly, it can be said that the manufacturing method of the present invention is effective upon production of a film formed of a patterned organic semiconductor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-232717, filed Oct. 24, 2011, which is hereby incorporated by reference herein in its entirety.

The invention claimed is:

1. A method of manufacturing a film, comprising:
applying, onto a substrate, a photocurable composition containing a polymerizable monomer, a photopolymerization initiator, and a photosensitive gas generator that generates a gas through light stimulation to form an applied film;
bringing a mold into contact with the applied film;
irradiating the applied film with light through the mold to cure the applied film and to generate the gas in the applied film; and
releasing the mold from the applied film after the irradiation of the applied film with the light to form a film having a predetermined pattern shape on the substrate,
wherein in the irradiation of the applied film with the light, a reaction rate of a polymerization reaction of the polymerizable monomer in the applied film is higher than a reaction rate of a gas-generating reaction of the photosensitive gas generator in the applied film, and
wherein the photosensitive gas generator comprises a molecule with a repeating unit of an ethylene oxide group at a non-terminal location.

2. The method according to claim 1, wherein:
the photopolymerization initiator in the photocurable composition comprises 2-benzyl-2-dimethylamino-1-(4-morpholinophenyl)-1-butanone;
the photosensitive gas generator in the photocurable composition comprises a 1,2-naphthoquinonediazide-5-sulfonic acid amide-based compound; and
the light with which the applied film is irradiated has a wavelength of 313±5 nm.

3. The method according to claim 1, wherein:
the photopolymerization initiator in the photocurable composition comprises 2-hydroxy-2-methyl-1-phenyl-propan-1-one;
the photosensitive gas generator in the photocurable composition comprises a 1,2-naphthoquinonediazide-5-sulfonic acid amide-based compound; and
the light with which the applied film is irradiated has a wavelength of 254±5 nm.

4. The method according to claim 1, wherein:
the photopolymerization initiator in the photocurable composition comprises 2-benzyl-2-dimethylamino-1-(4-morpholinophenyl)-1-butanone;
the photosensitive gas generator in the photocurable composition comprises a 1,2-naphthoquinonediazide-5-sulfonic acid amide-based compound; and
the light with which the applied film is irradiated has a wavelength of 313±5 nm or 254±5 nm.

5. A method of manufacturing a substrate with a circuit, comprising processing a substrate with a film obtained by the manufacturing method according to claim 1 as a mask to form a circuit on the substrate.

6. A method of manufacturing an optical component including:
a substrate; and
a member provided on the substrate and having a predetermined pattern shape,
the method comprising manufacturing the member by the manufacturing method according to claim 1.

7. The method according to claim 1, wherein a viscosity of the photocurable composition is 6 cP to 20 cP.

8. The method according to claim 1, wherein a weight ratio of the photosensitive gas generator to the photocurable composition is 5/102 or more.

* * * * *